(12) United States Patent
Kim et al.

(10) Patent No.: US 12,494,170 B2
(45) Date of Patent: Dec. 9, 2025

(54) DISPLAY DEVICE

(71) Applicant: LG Display Co., Ltd., Seoul (KR)

(72) Inventors: Ji Ah Kim, Paju-si (KR); Bo Gun Seo, Paju-si (KR); Joung Mi Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/519,941

(22) Filed: Nov. 27, 2023

(65) Prior Publication Data
US 2024/0221656 A1    Jul. 4, 2024

(30) Foreign Application Priority Data
Dec. 30, 2022  (KR) .................. 10-2022-0190283

(51) Int. Cl.
*G09G 3/3233* (2016.01)
*G09G 3/3225* (2016.01)
*H10K 59/121* (2023.01)
*H10K 59/131* (2023.01)

(52) U.S. Cl.
CPC ......... *G09G 3/3233* (2013.01); *G09G 3/3225* (2013.01); *H10K 59/121* (2023.02); *H10K 59/1213* (2023.02); *H10K 59/131* (2023.02); G09G 2300/0413 (2013.01); G09G 2300/0426 (2013.01); G09G 2300/0861 (2013.01); G09G 2320/0233 (2013.01); G09G 2320/0686 (2013.01)

(58) Field of Classification Search
CPC ......... G09G 3/3233; G09G 2300/0426; G09G 2300/0413; G09G 3/3225; G09G 2320/0233; G09G 2300/0861; G09G 2320/0686; G09G 3/32; H10K 59/131; H10K 59/88; H10K 59/122; H10K 59/1213
See application file for complete search history.

(56) References Cited

U.S. PATENT DOCUMENTS

| | | | |
|---|---|---|---|
| 2015/0102312 A1* | 4/2015 | Lee | H10K 59/88 257/40 |
| 2020/0394964 A1* | 12/2020 | Hyun | H10K 59/121 |
| 2021/0057494 A1* | 2/2021 | Chung | H10K 59/353 |
| 2021/0066409 A1* | 3/2021 | Fan | G06F 1/1605 |
| 2021/0126077 A1* | 4/2021 | Chae | H10K 77/00 |

(Continued)

FOREIGN PATENT DOCUMENTS

| | | |
|---|---|---|
| KR | 10-2021-0080710 A | 7/2021 |
| KR | 10-2021-0130891 A | 11/2021 |
| KR | 10-2022-0051619 A | 4/2022 |

*Primary Examiner* — Dismery Mercedes
(74) *Attorney, Agent, or Firm* — Birch, Stewart, Kolasch & Birch, LLP

(57) ABSTRACT

A display device can include a first display region including a plurality of first pixels, a second display region including a plurality of second pixels, and a boundary region disposed between the first display region and the second display region. The boundary region includes the plurality of first pixels and the plurality of second pixels. Also, the plurality of first pixels respectively include a plurality of first pixel circuits, the plurality of second pixels respectively include a plurality of second pixel circuits, and a transmittance of each of the plurality of second pixel circuits is higher than a transmittance of each of the plurality of first pixel circuits.

19 Claims, 18 Drawing Sheets

(56) References Cited

U.S. PATENT DOCUMENTS

| | | | |
|---|---|---|---|
| 2021/0335969 A1* | 10/2021 | Park | H10K 59/126 |
| 2022/0093699 A1* | 3/2022 | Liu | H10K 59/1213 |
| 2022/0165806 A1* | 5/2022 | Yun | H10K 59/121 |
| 2022/0310723 A1* | 9/2022 | Wang | H10K 59/131 |
| 2022/0352280 A1* | 11/2022 | Park | H10K 59/131 |
| 2023/0026822 A1* | 1/2023 | Wang | H10D 86/441 |
| 2023/0053413 A1* | 2/2023 | Liu | H10K 59/352 |
| 2023/0337465 A1* | 10/2023 | Huang | H10D 86/423 |
| 2023/0345790 A1* | 10/2023 | Lou | H10K 59/1216 |
| 2025/0078751 A1* | 3/2025 | Li | G09G 3/2007 |

* cited by examiner

DISPLAY DEVICE

CROSS-REFERENCE TO RELATED APPLICATION

This application claims priority to Korean Patent Application No. 10-2022-0190283, filed in the Republic of Korea on Dec. 30, 2022, the entirety of which is incorporated herein by reference into the present application.

BACKGROUND

Field of the Invention

Embodiments of the present disclosure relate to a display device an improved imaging region.

Discussion of Related Art

Electroluminescence display devices can be classified into inorganic light-emitting display devices and organic light-emitting display devices depending on the types of materials of an emission layer. An active-matrix-type organic light-emitting display device includes an organic light-emitting diode (OLED) that emits light by itself and has advantages in terms of a quick response time, high luminous efficiency, high luminance, and a wide viewing angle. The organic light-emitting display device can have an OLED formed in each pixel. The organic light-emitting display device can represent a black grayscale as perfect black as well as having a quick response time, high luminous efficiency, high luminance, and a wide viewing angle, and thus has an excellent contrast ratio and color gamut.

Recently, multimedia functions of a mobile terminal have been improved. For example, a camera can be built into a mobile terminal and the resolution of the camera is increasing to a level of an existing digital camera. However, a front camera of the mobile terminal can limit the design of a screen, thereby making it difficult to design the screen. In order to reduce the space occupied by the camera, a screen design including a notch or a punch hole has been used in the mobile terminal, but such can be difficult to implement a full-screen display because a screen size is still limited due to the camera.

In order to implement a full-screen display, a method of preparing an imaging region in which low-resolution pixels are disposed in a screen of a display panel, and disposing a camera and/or various sensors in the imaging region, has been proposed. However, the imaging region of the display screen can create a visible boundary that has an abrupt change in luminance, which can impair a user's viewing experience.

SUMMARY OF THE DISCLOSURE

An embodiment is directed to providing a display device in which a boundary of an imaging region is not visible.

It should be noted that the object of the present disclosure is not limited to the above-described object, and other objects of the present disclosure will be apparent to those skilled in the art from the following descriptions.

According to an aspect of the present disclosure, there is provided a display device including a first display region including a plurality of first pixels, a second display region including a plurality of second pixels, and a boundary region disposed between the first display region and the second display region, in which the boundary region includes the plurality of first pixels and the plurality of second pixels, each of the plurality of first pixels includes a first pixel circuit, each of the plurality of second pixels includes a second pixel circuit, and a transmittance of the second pixel circuit is higher than a transmittance of the first pixel circuit.

According to an aspect of the present disclosure, the boundary region can include a first boundary region in which a density of the plurality of second pixel circuits is higher than a density of the plurality of first pixel circuits, and a second boundary region which is disposed between the first boundary region and the first display region and in which the density of the plurality of first pixel circuits is higher than the density of the plurality of second pixel circuits.

According to an aspect of the present disclosure, the boundary region can include a first boundary region in which a ratio of the plurality of first pixel circuits to the plurality of second pixel circuits is 1:1, a second boundary region which is disposed between the first boundary region and the first display region and in which a ratio of the plurality of first pixel circuits to the plurality of second pixel circuits is 2:1, and a third boundary region which is disposed between the second boundary region and the first display region and in which a ratio of the plurality of first pixel circuits to the plurality of second pixel circuits is 3:1.

According to an aspect of the present disclosure, an average maximum luminance of the third boundary region can be higher than an average maximum luminance of the second boundary region.

According to an aspect of the present disclosure, a maximum luminance of the first pixels and a maximum luminance of the second pixels can be different from each other.

According to an aspect of the present disclosure, the number of transistors in the first pixel circuit can be greater than that in the second pixel circuit.

According to an aspect of the present disclosure, the boundary region can include a pixel region in which the second pixel is disposed, a plurality of light-transmitting regions, and a dummy pixel disposed in the light-transmitting region, and the second pixel can include an electrode extension portion extending from an anode and electrically connected to the dummy pixel.

According to an aspect of the present disclosure, the anode can be a reflective electrode and the electrode extension portion can be a transparent electrode.

According to an aspect of the present disclosure, a gate line through which a gate signal is output to the plurality of first pixels in the first display region can be connected to a gate line through which the gate signal is output to the plurality of second pixels in the second display region.

According to an aspect of the present disclosure, the gate line of the first display region and the gate line of the second display region can be connected to a gate line of the boundary region.

According to an aspect of the present disclosure, the first pixel circuit can include a first active pattern, a first gate insulating film disposed on the first active pattern, a first gate electrode disposed on the first gate insulating film, an insulating layer disposed on the first gate electrode, a second active pattern disposed on the insulating layer, a second gate insulating film disposed on the second active pattern, and a second gate electrode disposed on the second gate insulating film, in which the first active pattern can be a polysilicon semiconductor layer, and the second active pattern can be an oxide semiconductor layer.

According to an aspect of the present disclosure, the second pixel circuit can include a third active pattern disposed on the same layer as the first active pattern, a third gate insulating film disposed on the third active pattern and integrally formed with the first gate insulating film, and a third gate electrode disposed on the third gate insulating film and disposed on the same layer as the first gate electrode.

According to an aspect of the present disclosure, the gate line can include a first scan line through which the gate signal is output to the first gate electrode of the first pixel circuit and the third gate electrode of the second pixel circuit, and a second scan line through which the gate signal is output to the second gate electrode of the first pixel circuit, in which, in the boundary region, the first scan line and the second scan line can overlap with each other in a thickness direction.

According to an aspect of the present disclosure, a density per unit area of the first pixel circuit can increase in the boundary region as it approaches the first display region.

BRIEF DESCRIPTION OF THE DRAWINGS

The above and other objects, features, and advantages of the present disclosure will become more apparent to those of ordinary skill in the art by describing example embodiments thereof in detail with reference to the accompanying drawings, in which.

DETAILED DESCRIPTION OF THE EMBODIMENTS

Figure 1:
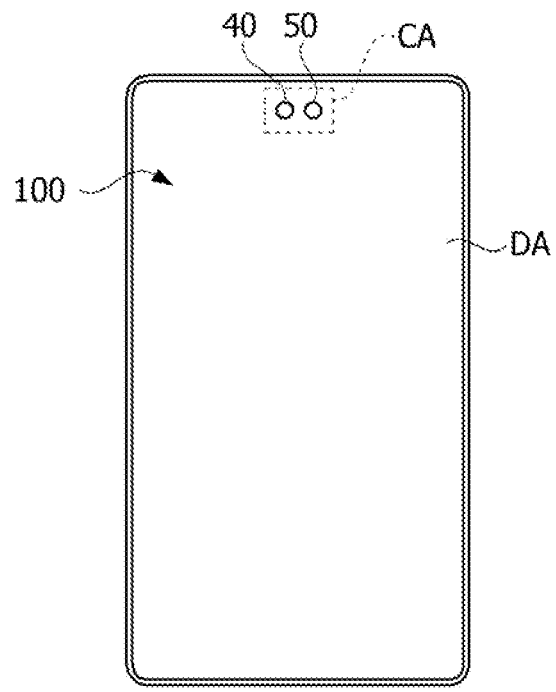
FIG. 1 is a conceptual diagram of a display device according to one embodiment of the present disclosure.

Advantages and features of the present disclosure and implementation methods thereof will be clarified through the following embodiments described with reference to the accompanying drawings. However, the present disclosure is not limited to the embodiments described below and can be implemented with a variety of different forms. The embodiments are merely provided to allow those skilled in the art to completely understand the scope of the present disclosure, and the present disclosure is defined only by the scope of the claims.

The figures, dimensions, ratios, angles, numbers, and the like disclosed in the drawings for describing the embodiments of the present disclosure are merely illustrative and are not limited to details shown in the present disclosure. Throughout the specification, like reference numerals refer to like components. Further, in describing the present disclosure, detailed descriptions of well-known technologies will be omitted when it is determined that they can unnecessarily obscure the gist of the present disclosure.

Terms such as "including," "having," "comprising," and "composed of" used herein are intended to allow other elements to be added unless the terms are used with the term "only." Any references to the singular can include the plural unless expressly stated otherwise.

Components are interpreted as including an ordinary error range even if not expressly stated.

For description of a positional relationship, for example, when the positional relationship between two parts is described as "on," "over," "above," "below," and "next to," or the like., one or more parts can be interposed therebetween unless the term "immediately" or "directly" is used in the expression.

In the description of embodiments, the terms "first," "second," and the like can be used herein to describe various components, the components are not limited by the terms. These terms are used only to distinguish one component from another and may not define order or sequence. Accordingly, a first component described below could be termed a second component without departing from the technical spirit of the present disclosure.

Throughout the specification, like reference numerals refer to like components.

The features of various embodiments can be partially or entirely combined with each other. The embodiments can be interoperated and performed in technically various ways and can be carried out independently of or in association with each other.

Hereinafter, various embodiments of the present disclosure will be described in detail with reference to the accompanying drawings. All the components of each display device according to all embodiments of the present disclosure are operatively coupled and configured.

Figure 2:
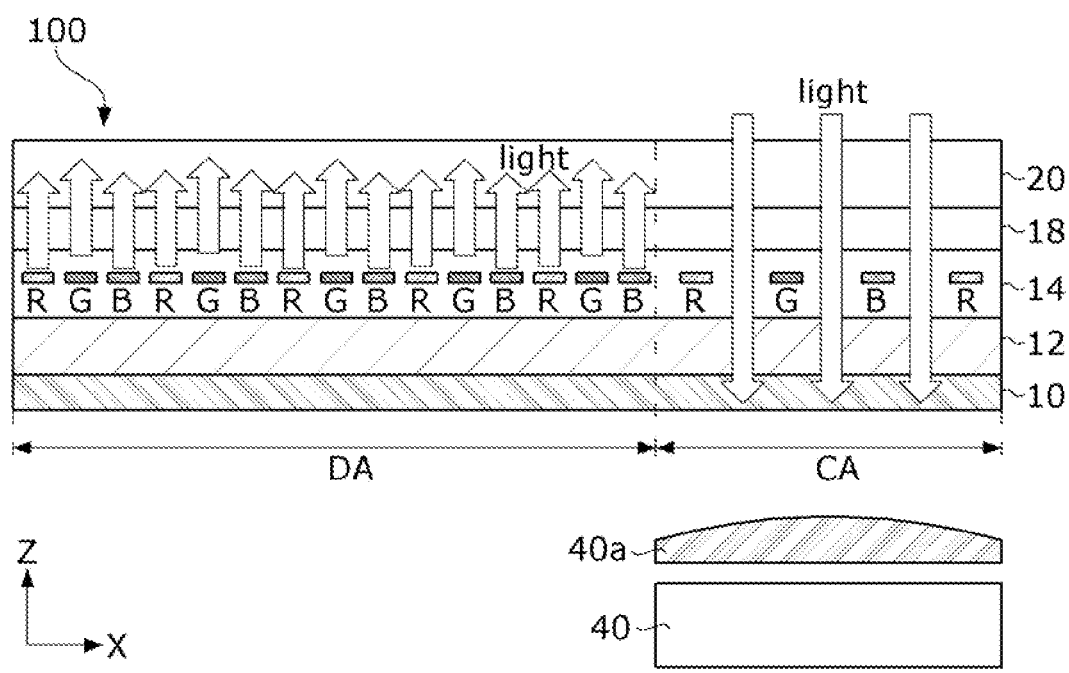
FIG. 2 is a cross-sectional view schematically illustrating a display panel according to one embodiment of the present disclosure.
Figure 3:
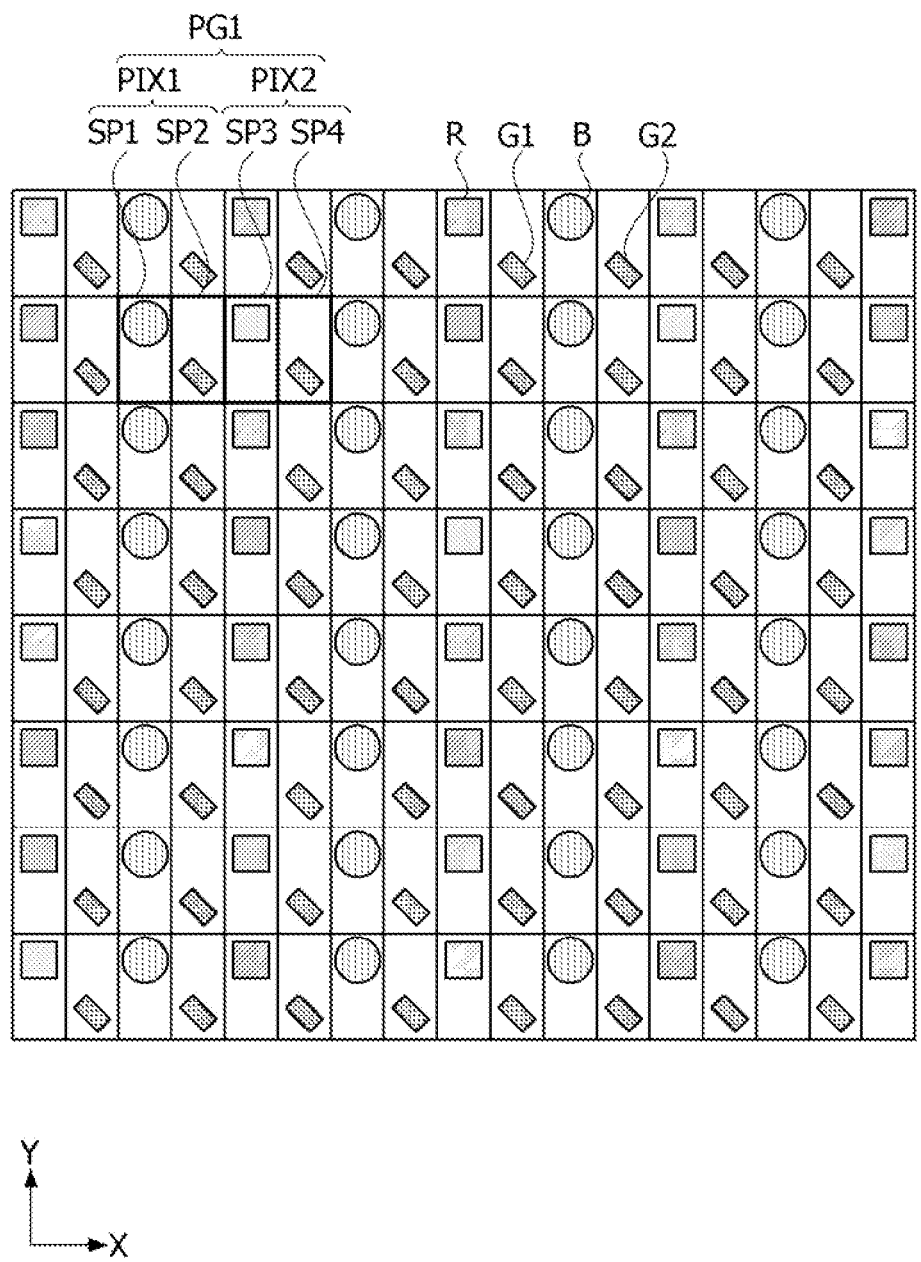
FIG. 3 is a view illustrating a pixel arrangement in a first display region according to one embodiment of the present disclosure.

FIG. 1 is a conceptual diagram of a display device according to one embodiment of the present disclosure. FIG. 2 is a cross-sectional view schematically illustrating a display panel according to the embodiment of the present disclosure. FIG. 3 is a view illustrating a pixel arrangement in a first display region according to one embodiment of the present disclosure.

Referring to FIG. 1, in the display device, the entire surface of a display panel 100 can be configured as a display region. Accordingly, a full-screen display can be enabled. Here, the display device can be (or can be included as part of) a mobile terminal such as a smart phone, but other examples are possible.

The display region can include a first display region DA and a second display region CA. The first display region DA and the second display region CA can both output images, but can have different resolutions from each other. As an example, the resolution (or density) of a plurality of second pixels disposed in the second display region CA can be lower than that of a plurality of first pixels disposed in the first display region DA. A relatively large amount of light can be injected into sensors 40 and 50 disposed in the second display region CA by as much as the resolution (or density) lowered in the plurality of second pixels disposed in the second display region CA.

However, the present disclosure is not necessarily limited thereto, and the resolution of the first display region DA and the resolution of the second display region CA can be the same as long as the second display region CA can have sufficient light transmittance or an appropriate compensation algorithm can be implemented.

The second display region CA can be a region in which the sensors 40 and 50 are disposed. The second display region CA is a region that overlaps with various sensors and thus can be smaller in area than a region of the first display region DA outputting a majority of the image. The second display region CA can be a sensing region in which various sensors collect information. The second display region CA is illustrated as being disposed at an upper end of the display device, but the present disclosure is not necessarily limited thereto. The position and area of the second display region CA can be variously modified.

The sensors 40 and 50 can include at least one of an image sensor, a proximity sensor, an illumination sensor, a gesture sensor, a motion sensor, a fingerprint recognition sensor, and a biometric sensor. As an example, a first sensor 40 can be an imaging unit configured to capture an image or a video, and a second sensor 50 can be an illumination sensor or an infrared sensor, but the present disclosure is not necessarily limited thereto.

Referring to FIGS. 2 and 3, the first display region DA and the second display region CA can include a pixel array in which pixels are disposed, to which pixel data is written. The number of pixels per unit area (hereinafter, referred to as "pixels per inch (PPI)") of the second display region CA can be lower than that of the first display region DA in order to ensure the light transmittance of the second display region CA.

The pixel array of the first display region DA can include a pixel region in which a plurality of pixels having a high PPI are disposed. The pixel array of the second display region CA can include a pixel region in which a plurality of pixels having a relatively low PPI are disposed by being spaced apart from each other by light-transmitting regions. In the second display region CA, external light can pass through the display panel 100 through the light-transmitting regions having high light transmittance and can be received by a sensor placed below the display panel 100.

Since both the first display region DA and the second display region CA include the pixels, an input image can be implemented across both of the first display region DA and the second display region CA. Accordingly, a full-screen display can be enabled.

Each of the pixels of the first display region DA and the second display region CA can include sub-pixels having different colors to implement a color of an image. The sub-pixels can include red, green, and blue sub-pixels. Also, the pixel can further include a white sub-pixel. Each of the sub-pixels can include a pixel circuit unit, and red, green, and blue light-emitting elements (organic light-emitting diode: OLED).

The second display region CA can include the pixels, and a lens 40a and an imaging unit 40 that are disposed below a screen of the display panel 100. The imaging unit 40 can be a camera including an image sensor. The pixels of the second display region CA can display an input image by writing pixel data of the input image in a display mode.

The imaging unit 40 can capture an external image in an imaging mode and output photo or video image data. The lens 40a of the imaging unit 40 can face the second display region CA. External light can be incident on the lens 40a of the imaging unit 40 through the second display region CA, and the lens 40a can condense or focus light. The imaging unit 40 can be a camera module, but is not necessarily limited thereto, and can be various image acquisition devices capable of acquiring an image.

Due to pixels being removed from the second display region CA in order to ensure a light transmittance, an image quality compensation algorithm for compensating luminance and color coordinates of the pixels in the second display region CA can be applied.

The display panel 100 can have a width in an X-axis direction, a length in a Y-axis direction, and a thickness in a Z-axis direction. The display panel 100 can include a circuit layer 12 disposed on a substrate 10, and a light-emitting element layer 14 disposed on the circuit layer 12. A polarizing plate 18 can be disposed on the light-emitting element layer 14, and a cover glass 20 can be disposed on the polarizing plate 18.

The circuit layer 12 can include a pixel circuit connected to lines, such as data lines, gate lines, power lines, and the like, a gate driving unit connected to the gate lines, and the like.

The circuit layer 12 can include a circuit element such as a transistor implemented as a thin-film transistor (TFT), a capacitor, and the like. The lines and circuit elements of the circuit layer 12 can be implemented with a plurality of insulating layers, two or more metal layers separated from each other with the insulating layers therebetween, and an active pattern including a semiconductor material.

The light-emitting element layer 14 can include a light-emitting element driven by the pixel circuit. The light-emitting element can be implemented as an OLED. The OLED can include an organic compound layer formed between an anode and a cathode.

The light-emitting element layer 14 can further include a color filter array disposed on the pixels that selectively transmit light of red, green, and blue wavelengths.

The light-emitting element layer 14 can be covered by a protective film, and the protective film can be covered by an encapsulation layer. The protective film and the encapsulation layer can have a structure in which organic films and inorganic films are alternately stacked. The inorganic films can block the penetration of moisture or oxygen. The organic films can planarize a surface of the inorganic film. When the organic films and the inorganic films are stacked in multiple layers, the penetration of moisture/oxygen affecting the light-emitting element layer 14 can be effectively blocked, since a movement path of the moisture or oxygen is increased in length as compared with a single layer.

The polarizing plate 18 can be disposed on the encapsulation layer. The polarizing plate 18 can improve outdoor visibility of the display device. The polarizing plate 18 can reduce the reflection of light from a surface of the display panel 100 and block the light reflected from metal of the circuit layer 12, thereby improving the brightness of the pixels. The polarizing plate 18 can be implemented as a polarizing plate to which a linear polarizing plate and a phase retardation film are bonded, or a circular polarizing plate.

Referring to FIG. 3, the first display region DA can include a plurality of first pixels PG1 arranged in a matrix form. A plurality of first pixels PG1 can include R, G1, G2, and B sub-pixels. For example, a first unit pixel PIX1 can include R and G1 sub-pixels SP1 and SP2, and a second unit pixel PIX2 can include B and G2 sub-pixels SP3 and SP4. However, the present disclosure is not necessarily limited thereto, and the plurality of first pixels PG1 can be real-type pixels including R, G, and B sub-pixels.

Figure 4:
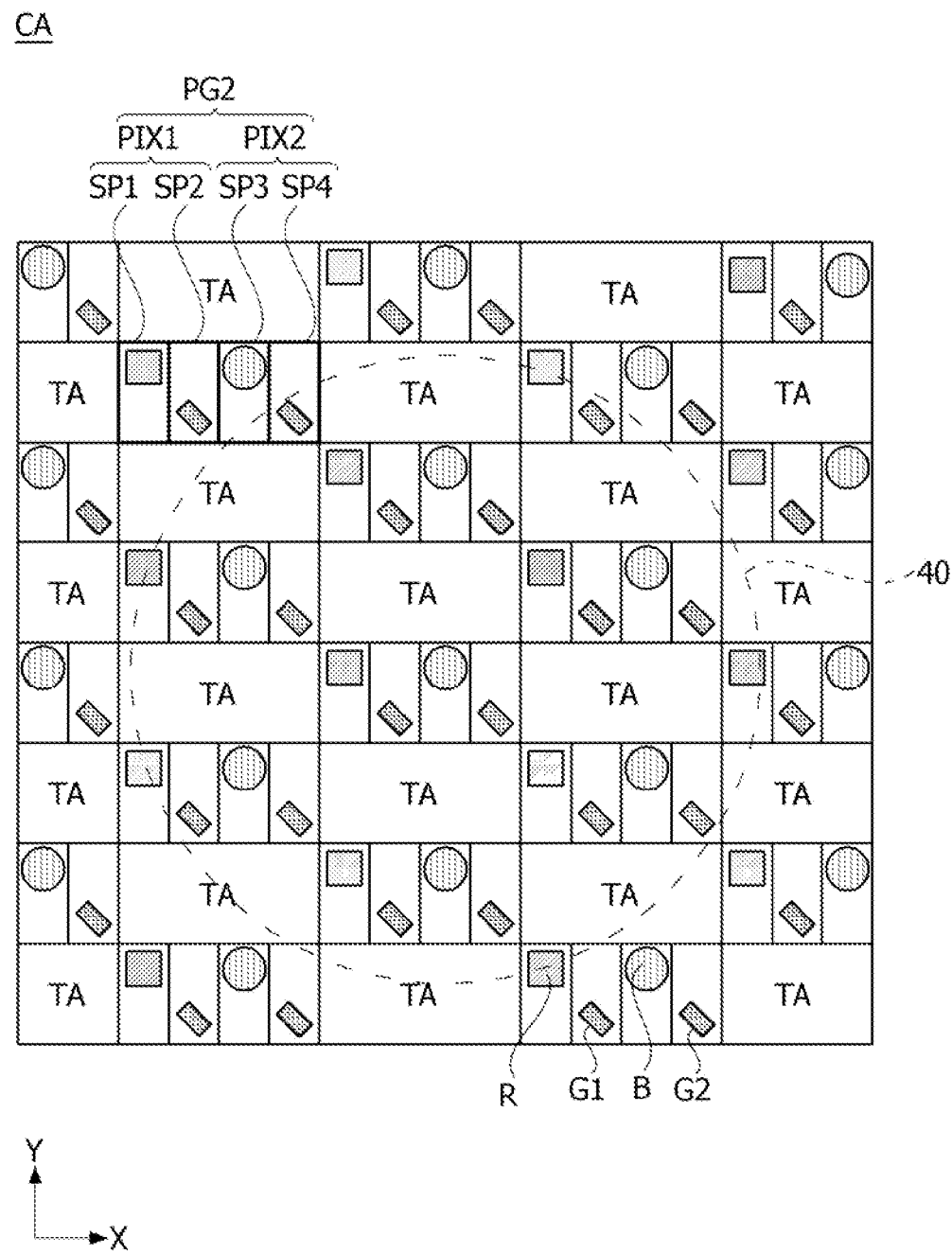
FIG. 4 is a view illustrating pixels and light-transmitting regions of a second display region according to one embodiment of the present disclosure.

FIG. 4 is a view illustrating pixels and light-transmitting regions of the second display region according to one embodiment of the present disclosure.

Referring to FIG. 4, the second display region CA can include a plurality of second pixels PG2 and a plurality of light-transmitting regions TA. The plurality of light-transmitting regions TA can be disposed between the plurality of second pixels PG2. Specifically, each of the light-transmitting regions TA and the second pixels PG2 can be alternately disposed in first and second directions. External light can be received by the imaging unit 40 through the light-transmitting regions TA. A resolution of the second display region CA can decrease relative to a resolution of the first display region DA by the extent to which an area of the light-transmitting region TA increases.

Each of the light-transmitting regions TA can include transparent media having high light transmittance without having metal so that light can be incident with minimum light loss. The light-transmitting region TA can be made of transparent insulating materials without including metal lines or pixels. As the light-transmitting region TA becomes larger, the light transmittance of the second display region CA can be higher.

Each of the plurality of second pixels PG2 can include one or two pixels. For example, in each of the second pixels PG2, the first unit pixel PIX1 can include the R and G1 sub-pixels SP1 and SP2, and the second unit pixel PIX2 can include the B and G2 sub-pixels SP3 and SP4. The pixel shape and arrangement of the second pixel PG2 can be the same as or different from those of the first pixel PG1.

The shape of the light-transmitting region TA is illustrated as being a quadrangular shape, but the present disclosure is not limited thereto. For example, the light-transmitting region TA can be designed in various shapes, such as a circular shape, an elliptical shape, a polygonal shape, or the like.

All metal electrode materials can be removed from the light-transmitting region TA (e.g., the light-transmitting region TA can be free of any metal material or reflective material). Accordingly, lines of the pixels can be disposed outside of the light-transmitting region TA. Thus, light can be effectively incident through the light-transmitting region. However, the present disclosure is not necessarily limited thereto, and the metal electrode material can be present in a partial region of the light-transmitting region TA.

Figure 5:
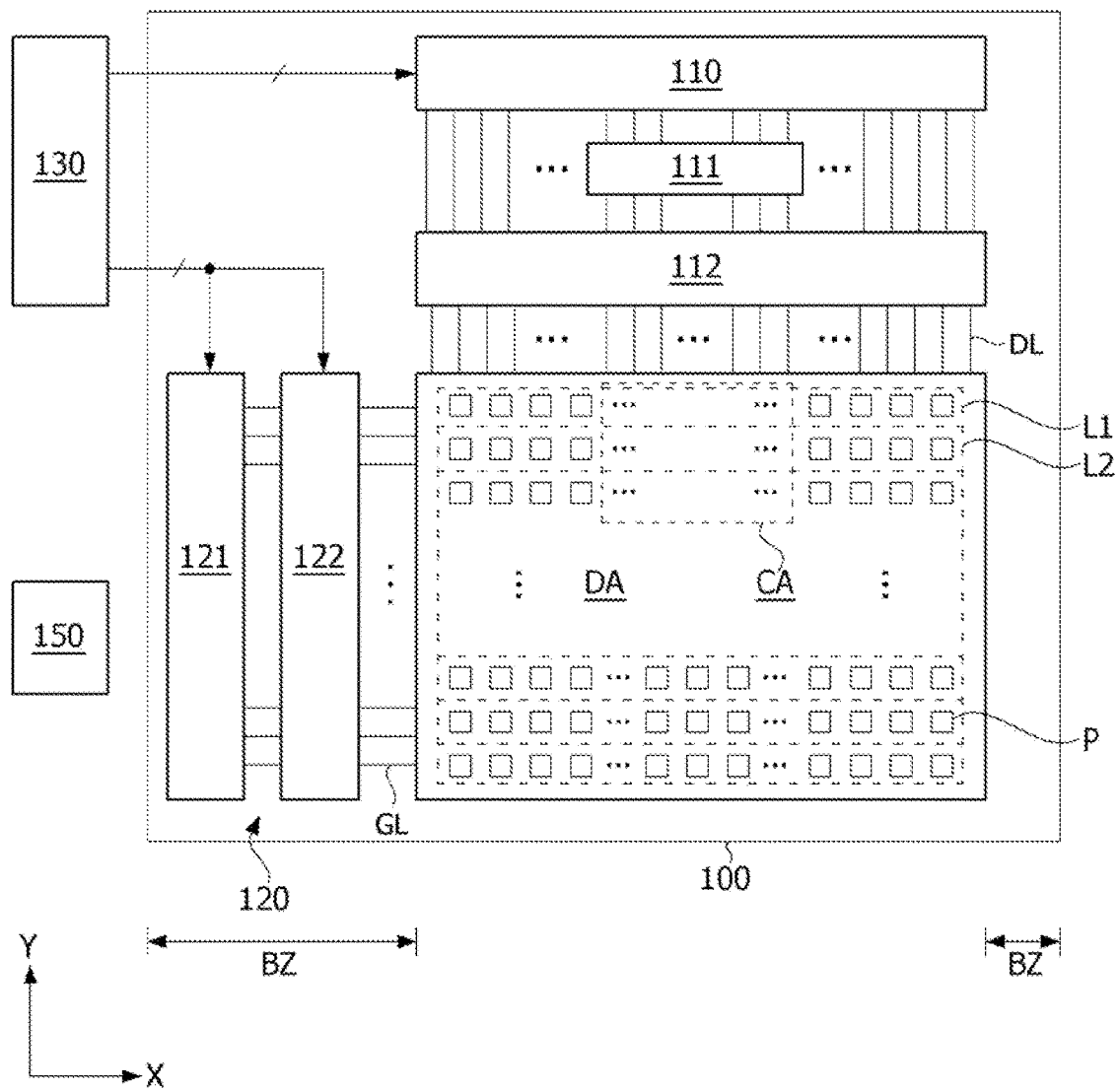
FIG. 5 is a block diagram illustrating the display device according to the embodiment of the present disclosure.

Referring to FIG. 5, the display device according to the embodiment of the present disclosure includes the display panel 100, display panel driving units 110, 111, and 120 for writing pixel data of an input image to pixels P of the display panel 100, a timing controller 130 for controlling the display panel driving units, and a power supply unit 150 configured to generate power required for driving the display panel 100.

The display panel 100 includes a pixel array configured to display an input image on a screen. The pixel array includes a plurality of pixel lines L1 and L2 (e.g., pixel rows). Each of the pixel lines L1 and L2 includes one line of pixels disposed in a line direction (X-axis direction) in the pixel array of the display panel 100. Pixels disposed in one pixel line share a gate line GL.

As described above, the pixel array can be divided into the first display region DA and the second display region CA having a lower resolution or PPI as compared with the first display region DA. Since the first display region DA includes high-PPI pixels P and thus has a larger size as compared with the second display region CA, a majority of the image information is displayed in the first display region DA. A sensor module that overlaps with the second display region CA can be disposed below the display panel 100.

Touch sensors can be disposed on the screen of the display panel 100. The touch sensors can be implemented as on-cell type or add-on type touch sensors, which are arranged on the screen of the display panel, or can be implemented as in-cell type touch sensors, which are embedded in the pixel array.

The display panel 100 can be implemented as a flexible display panel in which the pixels P are disposed on a flexible substrate such as a plastic substrate and a metal substrate. In a flexible display, the size and shape of the screen can be varied by a method of rolling, folding, and bending the flexible display panel. The flexible display can include a slidable display, a rollable display, a bendable display, a foldable display, and the like.

The display panel driving unit can drive the pixels P by applying an internal compensation technique.

The display panel driving unit reproduces an input image on the screen of the display panel 100 by writing pixel data of the input image to the sub-pixels. The display panel driving units includes a first data driving unit 110, a second data driving unit 111, and a gate driving unit 120. The display panel driving units can further include a demultiplexer 112 disposed between the data driving units 110 and 111 and data lines DL.

The display panel driving unit can operate in a low-speed driving mode under the control of the timing controller 130. In the low-speed driving mode, when the input image is analyzed and does not change for a predetermined time (e.g., a static image), power consumption of the display device can be reduced. In the low-speed driving mode, when a still image is input for a predetermined time or more, power consumption can be reduced by controlling a data write period of the pixels P to be longer by reducing a refresh rate of the pixels P. The low-speed driving mode is not limited to a situation when a still image or static image is input. For example, when the display device operates in a standby mode or when a user command or an input image is not input to a display panel driving circuit for a predetermined time or more, the display panel driving circuit can operate in the low-speed driving mode.

A first data driving unit 110 samples pixel data to be written to the pixels of the first display region DA from pixel data received from the timing controller 130. The first data driving unit 110 converts the pixel data to be written to the pixels of the first display region DA into a gamma compensation voltage using a digital-to-analog converter (hereinafter referred to as "DAC") and outputs a data voltage Vdata. The data voltage Vdata output from channels of the first data driving unit 110 can be applied to the data lines DL connected to the pixels of the first display region DA through the demultiplexer 112 or can be applied directly to the data lines DL.

The demultiplexer 112 time-divides and distributes the data voltage Vdata output through the channels of the data driving units 110 and 111 to a plurality of data lines DL. Due to the demultiplexer 112, the number of channels of the first data driving unit 110 can be reduced. The demultiplexer 112 can be omitted.

The gate driving unit 120 can be implemented as a gate in panel (GIP) circuit that is directly formed on a bezel region BZ of the display panel 100 together with a TFT array of the pixel array. The gate driving unit 120 outputs gate signals to the gate lines GL connected to the pixels of the first display region DA under the control of the timing controller 130. The gate driving unit 120 can sequentially supply the signals to the gate lines GL connected to the pixels of the first display region DA by shifting the gate signals using a shift register. A voltage of the gate signal swings between a gate-off voltage VGH and a gate-on voltage VGL.

The gate signal applied to the pixels of the first display region DA can include a pulse of a scan signal (hereinafter referred to as "scan pulse"), a pulse of an emission control signal (hereinafter referred to as "EM pulse"), and the like. The gate lines GL connected to the pixels of the first display region DA can include scan lines to which the scan pulse is applied and EM lines to which the EM pulse is applied.

Figure 6:
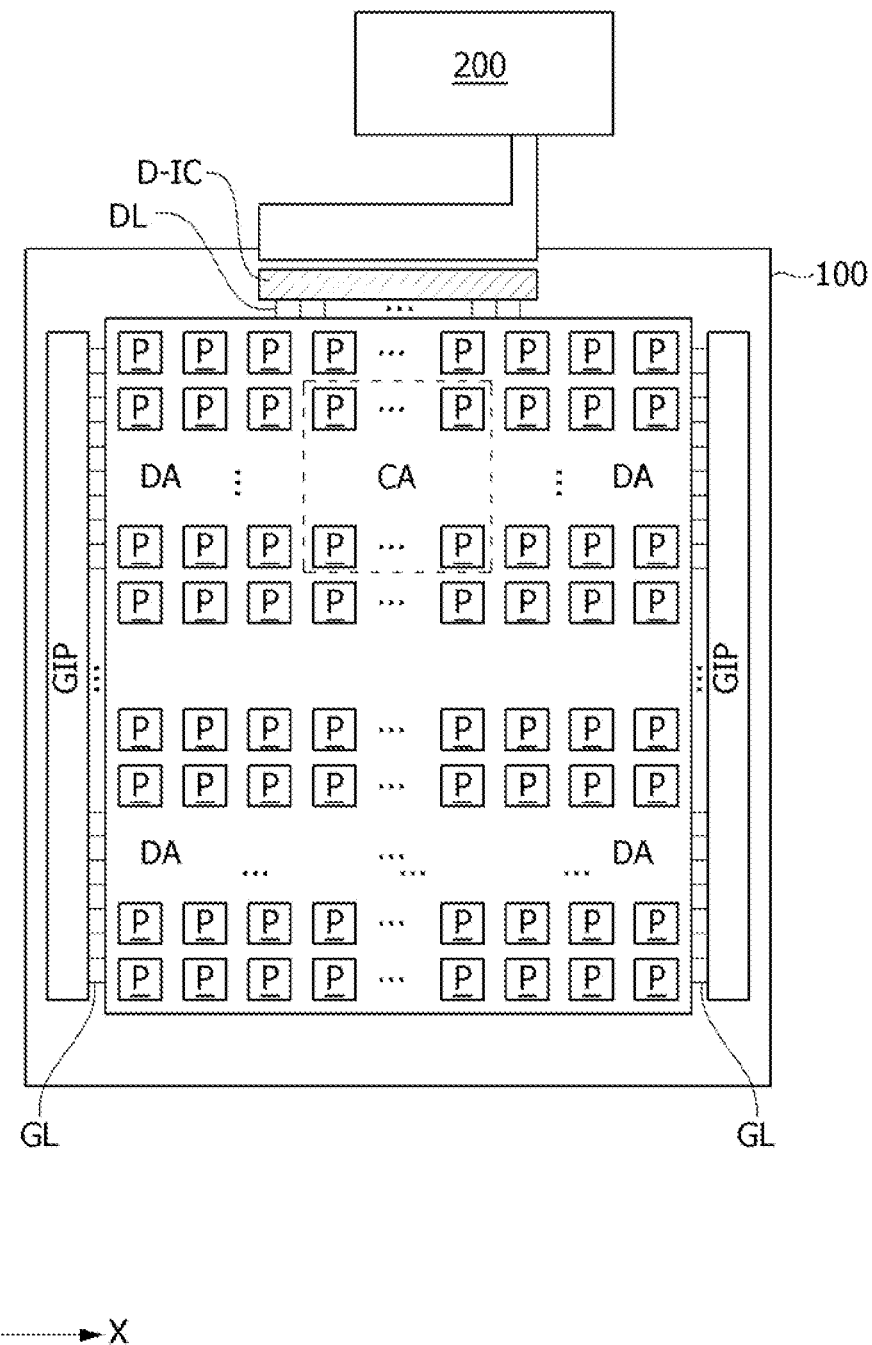
FIG. 6 is a diagram illustrating an example in which the display device according to the embodiment of the present disclosure is applied to an electronic device.

The gate driving unit 120 can be disposed on each of left and right bezels BZ of the display panel 100 to supply the gate signal to the gate lines GL using a double feeding method (e.g., see FIG. 6). In the double feeding method, the gate driving units 120 divided and disposed on both bezel of the display panel 100 are synchronized by the timing controller 130 so that the gate signals can be simultaneously applied at both ends of one gate line. In another embodiment, the gate driving unit 120 can be disposed on one side of the left and right bezels of the display panel 100 to supply the gate signals to the gate lines GL using a single feeding method.

The gate driving unit 120 can include a 1-1 gate driving unit 121 and a 1-2 gate driving unit 122. The 1-1 gate driving unit 121 outputs the scan pulse, and shifts the scan pulse according to a shift clock to sequentially supply the scan pulse to the scan lines connected to the pixels of the first display region DA and the second display region CA. The 1-2 gate driving unit 122 outputs the EM pulse, and shifts the EM pulse according to the shift clock to sequentially supply the EM pulse to the EM lines connected to the pixels of the first display region DA.

The timing controller 130 receives pixel data of an input image and a timing signal synchronized with the pixel data from a host system. The timing signal includes a vertical synchronization signal Vsync, a horizontal synchronization signal Hsync, a clock CLK, a data enable signal DE, and the like. One period of the vertical synchronization signal Vsync is one frame period. One period of each of the horizontal synchronization signal Hsync and the data enable signal DE is one horizontal period 1H. A pulse of the data enable signal DE is synchronized with one piece of line data to be written to the pixels P of one pixel line. Since a frame period and a horizontal period can be obtained through a method of counting the data enable signal DE, the vertical synchronization signal Vsync and the horizontal synchronization signal Hsync can be omitted.

The timing controller 130 transmits the pixel data of the input image to the first and second data driving units 110 and 111 and controls an operation timing of the display panel driving unit to synchronize the first and second data driving units 110 and 111, the demultiplexer 112, and the gate driving unit 120.

The timing controller 130 can multiply an input frame frequency by i (where i is a natural number) and control the operation timing of each of the display panel driving units 110, 111, 112, and 120 at a frame frequency of the input frame frequency×i Hz. The input frame frequency is 60 Hz in the National Television Standards Committee (NTSC) scheme and 50 Hz in the Phase-Alternating Line (PAL) scheme. The timing controller 130 can lower the frame frequency to a frequency between 1 Hz to 30 Hz, in order to lower the refresh rate of the pixels P in the low-speed driving mode.

The timing controller 130 can generate a data timing control signal for controlling an operation timing of the first data driving unit 110, a switch control signal for controlling an operation timing of the demultiplexer 112, and a gate timing control signal for controlling an operation timing of the gate driving unit 120 based on the timing signals Vsync, Hsync, and DE received from the host system.

The gate timing control signal can include a start pulse, a shift clock, a reset signal, an initialization signal, and the like. A voltage level of the gate timing control signal output from the timing controller 130 can be converted into a gate-off voltage VGH/VEH and a gate-on voltage VGL/VEL through a level shifter that is omitted from the drawing, and can be supplied to the gate driving unit 120. The level shifter can convert a low-level voltage of the gate timing control signal into the gate-on voltage VGL, and convert a high-level voltage of the gate timing control signal into the gate-off voltage VGH.

The power supply unit 150 can include a charge pump, a regulator, a buck converter, a boost converter, a programmable gamma integrated circuit (P-GMA IC), and the like. The power supply unit 150 generates power required for driving the display panel driving unit and the display panel 100 by adjusting a direct current (DC) input voltage from the host system. The power supply unit 150 can output DC voltages such as a gamma reference voltage, the gate-off voltage VGH/VEH, the gate-on voltage VGL/VEL, a pixel driving voltage ELVDD, a low-potential power supply voltage ELVSS, an initialization voltage Vini, a reference voltage Vref, and the like. The programmable gamma IC can change the gamma reference voltage according to a register setting value. The gamma reference voltage is supplied to the first data driving unit 110. The gate-off voltage VGH/VEH and the gate-on voltage VGL/VEL are supplied to the level shifter and the gate driving unit 120. The pixel driving voltage ELVDD, the low-potential power supply voltage ELVSS, the initialization voltage Vini, and the reference voltage Vref are commonly supplied to pixel circuits through the power lines. The pixel driving voltage ELVDD is set to a voltage higher than the low-potential power supply voltage ELVSS, the initialization voltage Vini, and the reference voltage Vref.

The host system can be a main circuit board of a television (TV) system, a set-top box, a navigation system, a personal computer (PC), a vehicle system, a home theater system, a mobile device, or a wearable device.

Figure 7:
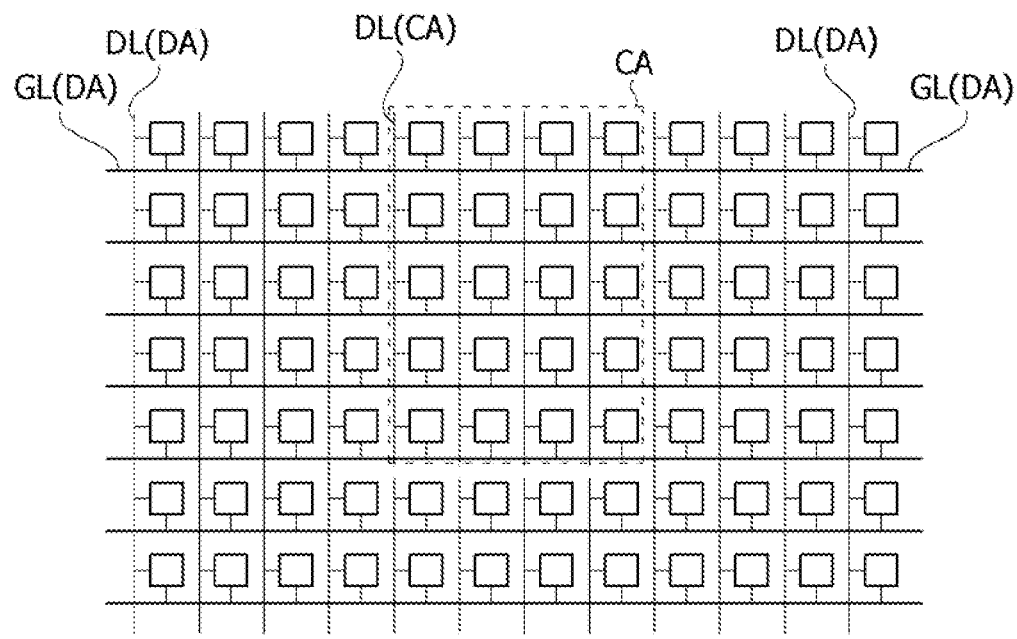
FIG. 7 is a view illustrating data lines and gate lines of the first display region and the second display region.

FIG. 7 is a view illustrating data lines and gate lines of the first display region and the second display region.

Referring to FIG. 7, the gate lines GL can be commonly applied to the first display region DA and the second display region CA. Accordingly, the same scan signal and emission signal can be applied to the first pixels disposed in the first display region DA and the second pixels disposed in the second display region CA.

However, the data lines DL can be separated in the first display region DA and the second display region CA. In order to compensate for a luminance difference between the first and second display regions DA and CA, a voltage range applied to the data lines DL of the second display region CA can be greater than a voltage range applied to the data lines DL of the first display region DA. For example, the voltages applied to the data lines DL in the second display region CA can be boosted. However, the present disclosure is not necessarily limited thereto, and the data lines DL of the first and second display regions DA and CA can be connected to each other to have the same voltage range.

Figure 8:
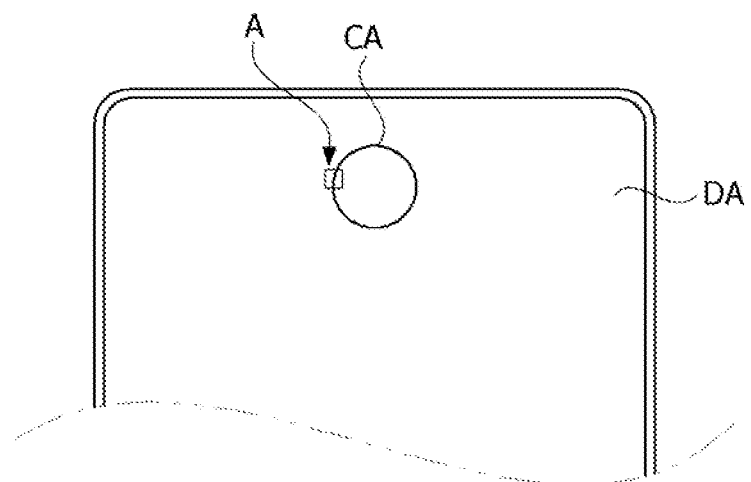
FIG. 8 is a view illustrating the second display region according to one embodiment of the present disclosure.
Figure 9:
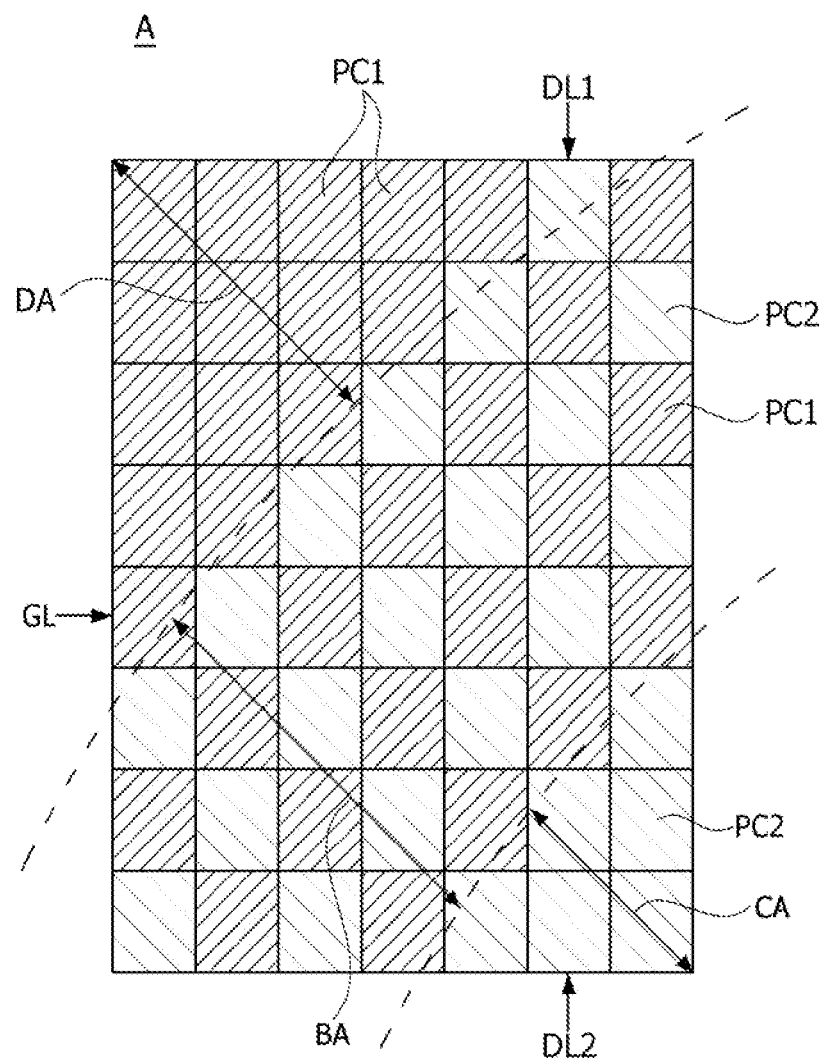
FIG. 9 is an enlarged view of portion A of FIG. 8 according to one embodiment of the present disclosure.

FIG. 8 is a view illustrating the second display region according to one embodiment of the present disclosure. FIG. 9 is an enlarged view of portion A of FIG. 8 according to one embodiment of the present disclosure. The display region of FIG. 8 can be part of a display device such as a mobile terminal or smart device.

Referring to FIGS. 8 and 9, the display device according to the embodiment can include a boundary region BA disposed between the first display region DA and the second display region CA. When the pixel circuits disposed in the first display region DA and the second display region CA are different from each other, the luminance of the pixels becomes different, and a boundary of the second display region CA can be visible from the outside which can impair image quality and distract from the viewing experience.

In particular, when the pixel circuit of the first display region DA is an internal compensation circuit and thus a data voltage in which a compensation value is calculated is applied therefrom, while the pixel circuit of the second display region CA is a non-compensation circuit, the luminance difference can be even greater.

Accordingly, it is necessary to gradually change the luminance between the first display region DA and the second display region CA so that the boundary between the first display region DA and the second display region CA is not visible (e.g., a blended transition can be provided).

According to the embodiment, in the boundary region BA between the first display region DA and the second display region CA, a first pixel circuit PC1 configured to drive the first pixel and a second pixel circuit PC2 configured to drive the second pixel can be mixedly disposed. Thus, the luminance difference can be reduced since the first pixel and the second pixel having different levels of brightness are mixedly disposed.

Here, the pixel circuit can be an aggregate of sub-pixel circuits configured to drive sub-pixels, or can refer to each sub-pixel circuit configured to drive each sub-pixel.

In the embodiment, it is illustrated that the first pixel circuit PC1 and the second pixel circuit PC2 are alternately disposed in the boundary region BA, but the present disclosure is not necessarily limited thereto. For example, a plurality of first pixel circuits PC1 can be consecutively disposed, and then the second pixel circuits PC2 can be disposed, and a light-transmitting region can be disposed between the first pixel circuit PC1 and the second pixel circuit PC2.

The first pixel circuit PC1 can be an internal compensation circuit, and the second pixel circuit PC2 can be a non-compensation circuit or an external compensation circuit without an internal compensation function. The second pixel circuit PC2 can have an improved aperture ratio since transistors for performing an internal compensation function are omitted. Accordingly, when the first pixel circuit PC1 and the second pixel circuit PC2 are mixedly disposed in the boundary region BA, the boundary region BA can have a uniform transmittance since regions with a high aperture ratio are mixed therein.

The first display region DA includes a first data line DL1 through which the data voltage is supplied to the first pixel circuit PC1, the second display region CA includes a second data line DL2 through which the data voltage is supplied to the second pixel circuit PC2, and the boundary region BA includes both the first pixel circuit PC1 and the second pixel circuit PC2 and thus can be connected to each of the first data line DL1 and the second data line DL2. The data voltages of different levels or the data voltages in the same range can be applied through the first data line DL1 and the second data line DL2.

In addition, the gate lines GL of the first display region DA, the boundary region BA, and the second display region CA can be connected to each other, so that the common scan pulse and emission pulse can be applied to the first pixel circuit PC1 and the second pixel circuit PC2.

Figure 10:
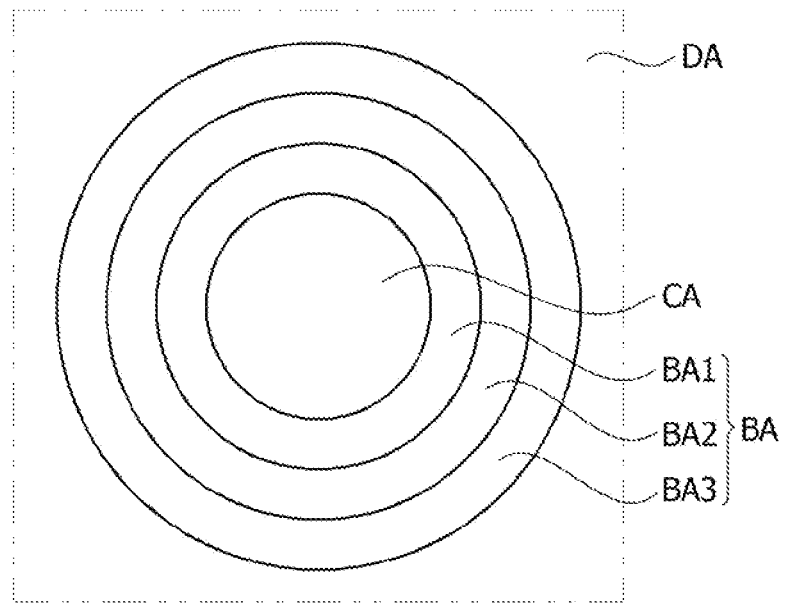
FIG. 10 is a view illustrating a plurality of boundary regions according to one embodiment of the present disclosure.
Figure 11:
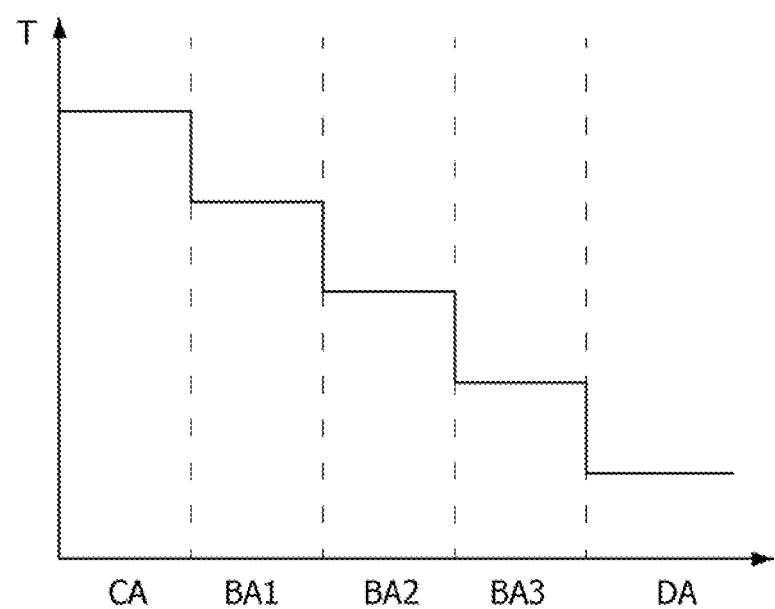
FIG. 11 is a graph illustrating a transmittance of each of the first display region, the second display region, and the boundary region according to one embodiment of the present disclosure.
Figure 12:
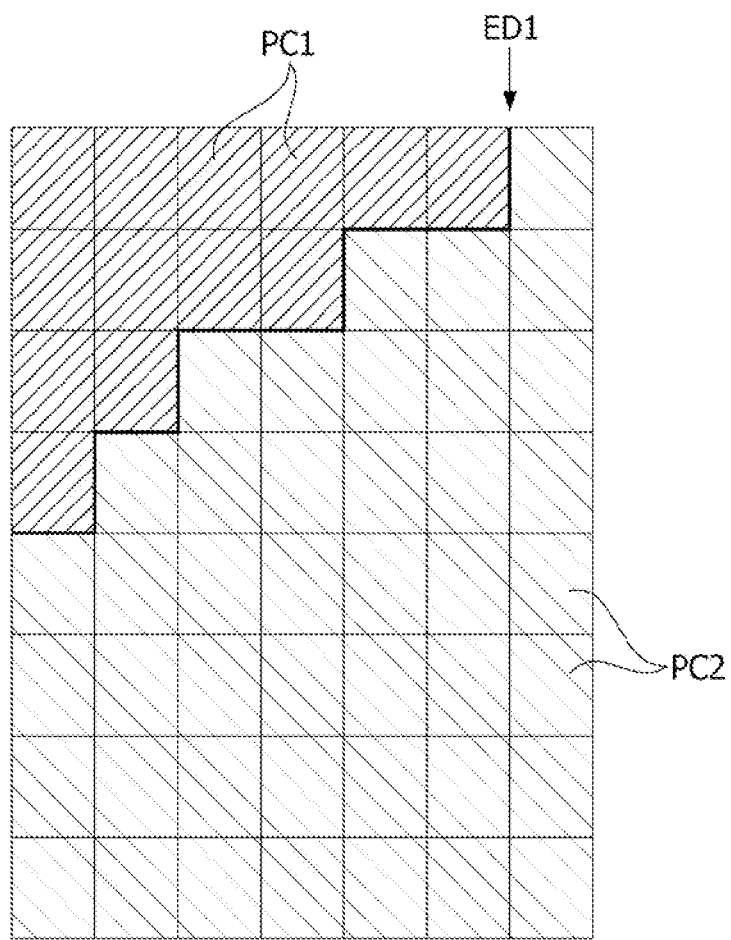
FIG. 12 is a view in which there is no boundary region between the first display region and the second display region according to one embodiment of the present disclosure.
Figure 13:
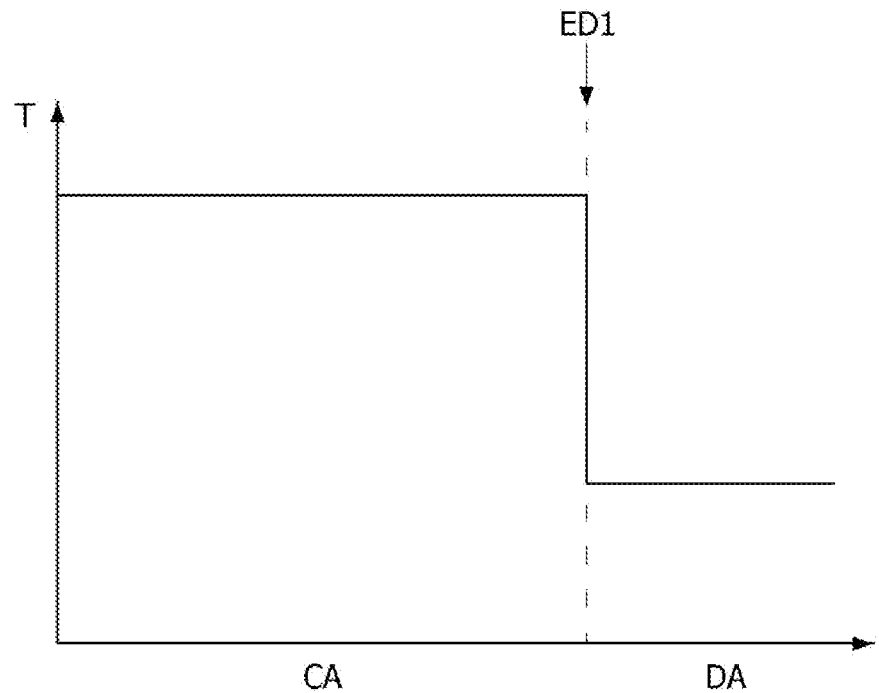
FIG. 13 is a graph illustrating transmittances in FIG. 12 according to one embodiment of the present disclosure.

FIG. 10 is a view illustrating a plurality of boundary regions according to one embodiment of the present disclosure. FIG. 11 is a graph illustrating a transmittance of each of the first display region, the second display region, and the boundary region according to one embodiment of the present disclosure. FIG. 12 is a view in which there is no boundary region between the first display region and the second display region as a comparative example. FIG. 13 is a graph illustrating transmittances in FIG. 12 of the comparative example.

Referring to FIG. 10, the boundary region BA can include a plurality of regions each having a different ratio of the first pixel circuits PC1 to the second pixel circuits PC2.

As an example, the boundary region BA can include a first boundary region BA1 in which a ratio (PC1:PC2) of the plurality of first pixel circuits PC1 to the plurality of second pixel circuits PC2 is 1:1, a second boundary region BA2 which is disposed between the first boundary region BA1 and the first display region DA and in which a ratio (PC1: PC2) of the plurality of first pixel circuits PC1 to the plurality of second pixel circuits PC2 is 2:1, and a third boundary region BA3 which is disposed between the second boundary region BA2 and the first display region DA and in which a ratio of the plurality of first pixel circuits PC1 to the plurality of second pixel circuits PC2 is 3:1.

With this configuration, a density per unit area of the first pixel circuit PC1 increases as it approaches the first display region DA, so that the luminance can gradually increase and the transmittance can gradually decrease. Accordingly, the boundary of the second display region CA can be prevented from being visible. For example, in this way, a blended transition can be provided that is not noticeable by the viewer, in order to improve the viewing experience.

As an example, an average maximum luminance of the third boundary region BA3 can be higher than an average maximum luminance of the second boundary region BA2, and the average maximum luminance of the second boundary region BA2 can be higher than an average maximum luminance of the first boundary region BA1. The average maximum luminance can be defined as the largest value in an average luminance of each boundary region.

However, the present disclosure is not necessarily limited thereto, and the configuration of the boundary region BA can be variously modified. As an example, the boundary region BA can include the first boundary region BA1 having a high ratio of the second pixel circuits PC2 and the second boundary region BA2 surrounding the first boundary region BA1 and having a high ratio of the first pixel circuits PC1.

The ratio of the first pixel circuits PC1 to the second pixel circuits PC2 can be further subdivided in the plurality of boundary regions BA. As an example, as the ratio of the second pixel circuits PC2 to the first pixel circuits PC1 can be designed to change to 1:2, 1:3, 1:4, 1:5, 1:6, and the like as it approaches the first display region DA. This type of situation can be more advantageous in terms of visibility and provide a softer transition.

Referring to FIG. 11, the transmittances can gradually decrease from the second display region CA to the first display region DA. The difference in transmittance at the boundary region BA can gradually decrease, which can improve the problem in which the boundary is visible from the outside. In addition, since the first pixel and the second pixel are alternately disposed and emit light, luminance uniformity can also be improved.

The first pixel can be a pixel whose data voltage is output by being compensated by the first pixel circuit PC1, and the second pixel can be a pixel whose data voltage is output by not being compensated by the second pixel circuit PC2 or being compensated by an external compensation.

Referring to FIGS. 12 and 13, when there is no boundary region BA between the first display region DA and the second display region CA, a luminance difference and a transmittance difference at a boundary EDI between the first display region DA and the second display region CA is so large that the boundary of the second display region CA is easily observed from the outside which can impair a user's viewing experience (e.g., the second display region CA may show up as a noticeably dull area of the screen or a dim patch).

However, according to the embodiment, since the first pixel circuit PC1 and the second pixel circuit PC2 are alternately disposed in the boundary region BA, the luminance becomes uniform, and the first pixel circuits PC1 and the second pixel circuits PC2 are disposed such that the ratio thereof is gradually changed, so that the luminance can be gradually changed and the transition is softened. Thus, the second display region CA may not be recognized from the outside, which can improve image quality.

Figure 14:
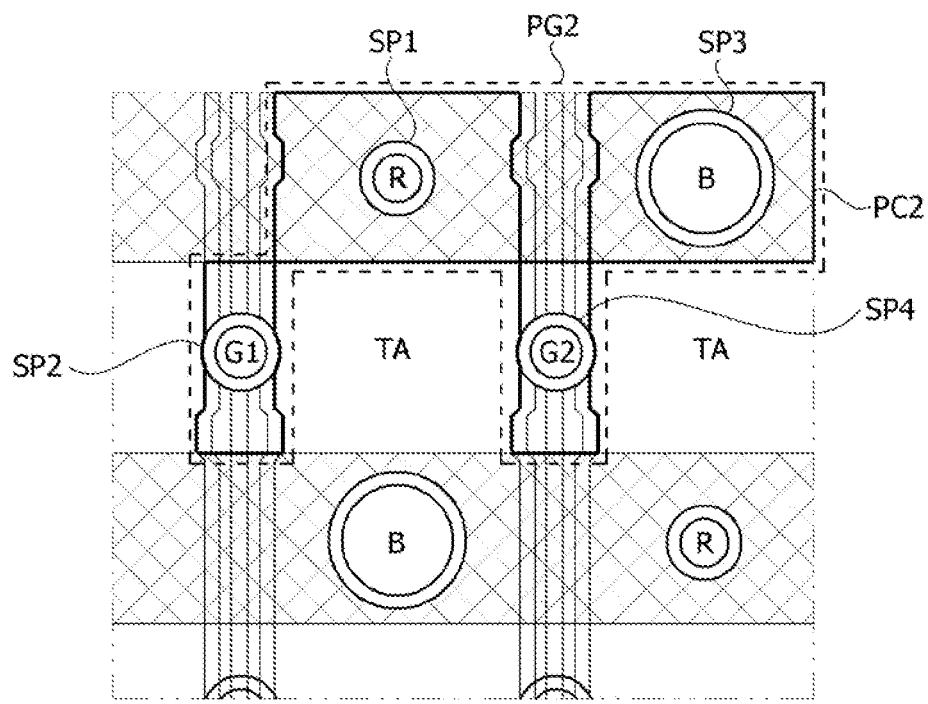
FIG. 14 is a view illustrating a second pixel of the second display region according to one embodiment of the present disclosure.
Figure 15:
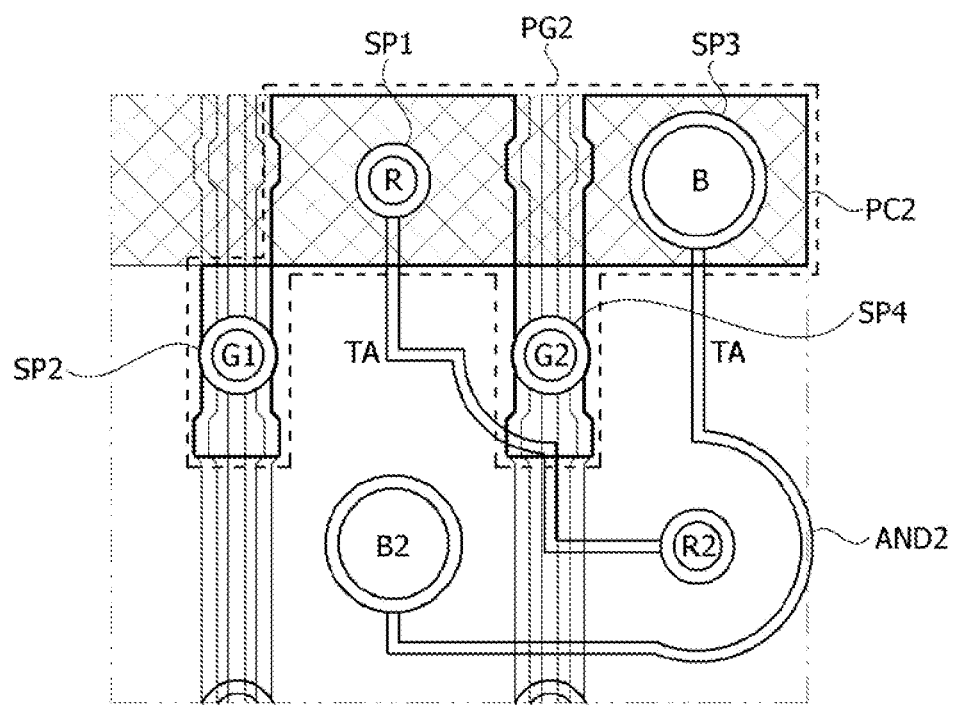
FIG. 15 is a modified example of FIG. 14 according to one embodiment of the present disclosure.
Figure 16:
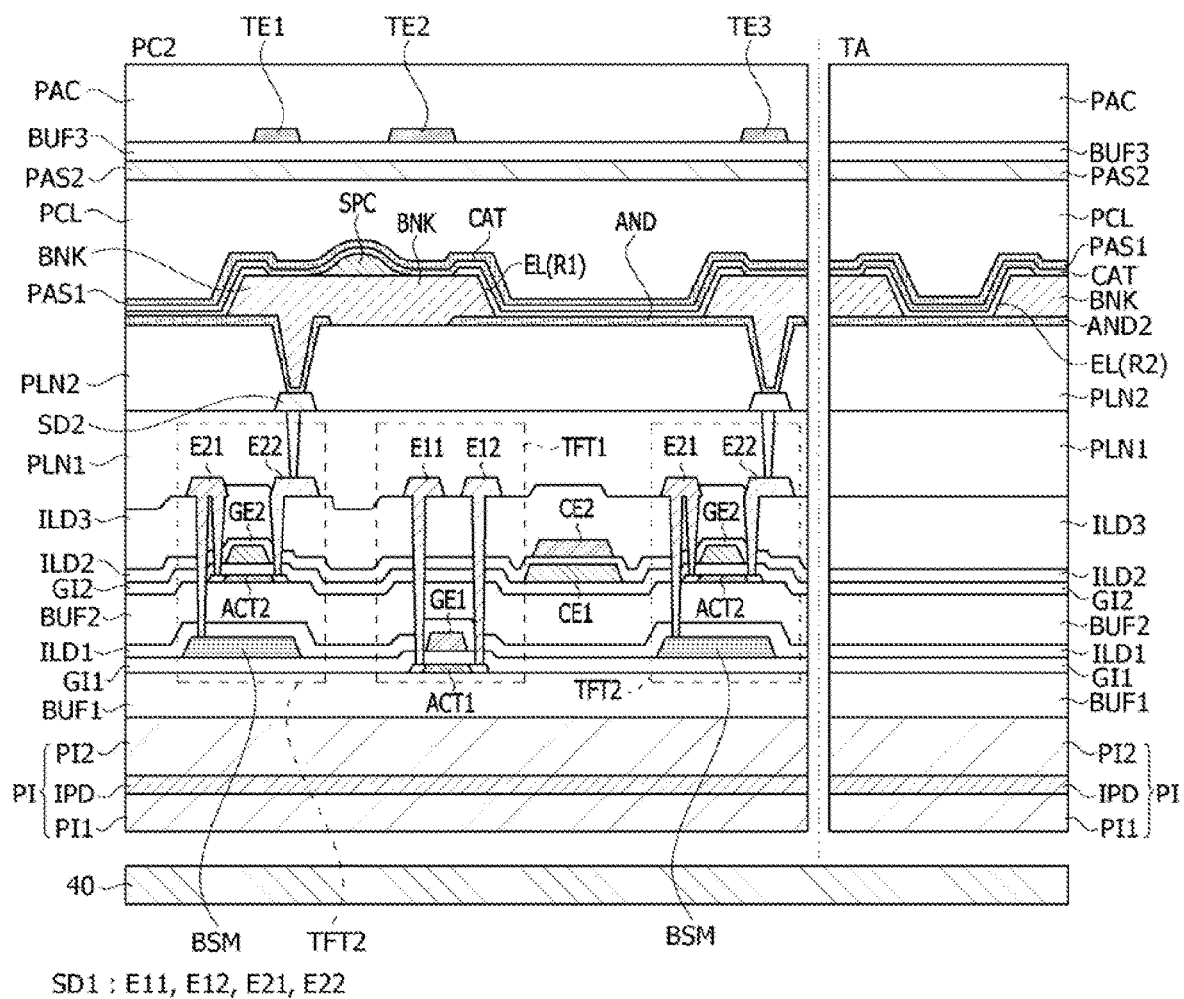
FIG. 16 is a cross-sectional view of a pixel region and a light-transmitting region of FIG. 15 according to one embodiment of the present disclosure.

FIG. 14 is a view illustrating the second pixel according to an embodiment of the present disclosure. FIG. 15 is a modified example of FIG. 14 according to an embodiment of the present disclosure. FIG. 16 is a cross-sectional view of the pixel region and the light-transmitting region of FIG. 15 according to an embodiment of the present disclosure.

Referring to FIG. 14, the plurality of second pixels PG2 can be disposed in the second display region CA. The second pixel PG2 can include a plurality of sub-pixels SP1, SP2, SP3, and SP4, and each of the sub-pixels SP1, SP2, SP3, and SP4 can include the second pixel circuit PC2.

As an example, the second pixel can include an R sub-pixel SP1, a G1 sub-pixel SP2, a B sub-pixel SP3, and a G2 sub-pixel SP4. However, this is merely an example, and the structure of the second pixel can be variously modified.

When the second pixel circuit PC2 of each sub-pixel is configured as a non-compensation circuit or an external compensation circuit, an aperture ratio can be increased. In addition, an area of the light-transmitting region TA disposed in the second display region CA can be increased. However, the present disclosure is not necessarily limited thereto, and some of the sub-pixels can have the first pixel circuit or can have the second pixel circuit. That is, the pixel circuit can be different between the sub-pixels in one pixel. Also, as shown in FIG. 14, the second pixel can have a shape that includes a main portion with a plurality of protrusions or fingers extending away from the main portion, which can form various types of shapes (e.g., a "F" shape or an "E" shape). For example, the R sub-pixel SP1 and B sub-pixel SP3 can form a main portion, and a G1 sub-pixel SP2 and a G2 sub-pixel SP4 can protrude from the main portion, but embodiments are not limited thereto.

Referring to FIG. 15, the second pixel PC2 can include dummy pixels B2 and R2. As an example, in the second pixel PG2, the number of the pixel circuits can be reduced by connecting an electrode extension portion AND2 of an anode to each of the adjacent dummy pixels B2 and R2.

As an example, the electrode extension portion AND2 of the anode of the R sub-pixel SP1 can be connected to an adjacent red dummy pixel R2. Accordingly, when the R sub-pixel SP1 is driven, the adjacent red dummy pixel R2 can also emit light. Similarly, the electrode extension portion AND2 of the anode of the B sub-pixel SP3 can be connected to an adjacent blue dummy pixel B2. Accordingly, when the B sub-pixel SP3 is driven, the adjacent blue dummy pixel B2 can also emit light. For example, dummy pixels B2 and R2 can also be referred to as slave pixels, since they are tied to another pixel acting as a master pixel and operate according to the master pixel.

With this configuration, the number of pixel circuits for driving the sub-pixels can be reduced by half. Thus, the aperture ratio can be further increased in the second display region CA and the boundary region BA and the transmittance can be improved.

Referring to FIG. 16, a substrate PI can include first and second substrates PI1 and PI2. In addition, an inorganic film IPD can be formed between the first substrate PI1 and the second substrate PI2. In this situation, the inorganic film IPD blocks moisture penetration. Here, the substrate PI can be formed of polyimide (PI) and thus can be referred to as a PI substrate, and the first and second substrates PI1 and PI2 can be referred to as first and second PI substrates.

A first buffer layer BUF1 can be formed on the second substrate PI2. The first buffer layer BUF1 can be formed as a multi-layered insulating film, in which two or more layers of an oxide film (SiO2) and a nitride film (SINx) are stacked. A first semiconductor layer is formed on the first buffer layer BUF1. The first semiconductor layer can include a polysilicon semiconductor layer patterned in a photolithography process. The first semiconductor layer can include a polysilicon active pattern ACT1 that forms a semiconductor channel in the first TFT TFT1.

A first gate insulating layer GI1 is deposited on the first buffer layer BUF1 to cover the first active pattern ACT1 of the first semiconductor layer. The first gate insulating layer GI1 includes an inorganic insulating material layer. A first metal layer is formed on the first gate insulating layer GI1. The first metal layer is insulated from the first semiconductor layer by the first gate insulating layer GI1.

The first metal layer includes metal patterns in which a single-layered metal or two or more layered metals are stacked, which are patterned in a photolithography process. The first metal layer can include a gate electrode GE1 of the first TFT TFT1 and a light shield pattern BSM below a second TFT TFT2.

A first interlayer insulating layer ILD1 is formed on the first gate insulating layer GI1 to cover the patterns of the first metal layer. The first interlayer insulating layer ILD1 includes an inorganic insulating material. A second buffer layer BUF2 is formed on the first interlayer insulating layer ILD1. The second buffer layer BUF2 includes a single-layered or multi-layered inorganic insulating material.

A second semiconductor layer includes an oxide semiconductor pattern ACT2 that forms a semiconductor channel in the second TFT TFT2. A second gate insulating layer GI2 is deposited on the second buffer layer BUF2 to cover the second active pattern ACT2 of the second semiconductor layer. The second gate insulating layer GI2 includes a single-layered or multi-layered inorganic insulating material. A second metal layer is formed on the second gate insulating layer GI2. The second metal layer is insulated from the second semiconductor layer by the second gate insulating layer GI2.

The second metal layer includes metal patterns in which a single-layered metal or two or more layered metals are stacked, which is patterned in a photolithography process. The second metal layer includes a gate electrode GE2 of the second TFT TFT2 and a lower capacitor electrode CE1.

A second interlayer insulating layer ILD2 is formed on the second gate insulating layer GI2 to cover the patterns of the second metal layer. The second interlayer insulating layer ILD2 includes a single-layered or multi-layered inorganic insulating material. A third metal layer is formed on the second interlayer insulating layer ILD2. The third metal layer is insulated from the second metal layer by the second interlayer insulating layer ILD2.

The third metal layer includes metal patterns in which a single-layered metal or two or more layered metals are stacked, which is patterned in a photolithography process. The third metal layer includes an upper capacitor electrode CE2. A capacitor Cst of the pixel circuit includes the upper capacitor electrode CE2, the lower capacitor electrode CE1, and a dielectric layer between the upper capacitor electrode CE2 and the lower capacitor electrode CEI, e.g., the second interlayer insulating layer ILD2.

A third interlayer insulating layer ILD3 is formed on the second interlayer insulating layer ILD2 to cover the patterns of the third metal layer. The third interlayer insulating layer ILD3 includes a single-layered or multi-layered inorganic insulating material. A fourth metal layer is formed on the third interlayer insulating layer ILD3. The fourth metal layer is insulated from the second semiconductor layer by the second gate insulating layer GI2.

The fourth metal layer SDI includes metal patterns in which a single-layered metal or two or more layered metals are stacked, which is patterned in a photolithography process. The fourth metal layer includes first and second electrodes E11 and E12 of the first TFT TFT1, and first and second electrodes E21 and E22 of the second TFT TFT2. The first and second electrodes E11 and E12 of the first TFT TFTI are connected to the first active pattern ACT1 through first contact holes passing through the insulating layers GI1, ILD1, BUF2, GI2, ILD2, and ILD3. The first and second electrodes E21 and E22 of the second TFT TFT2 are connected to the second active pattern ACT2 through second contact holes passing through the insulating layers GI2, ILD2, and ILD3. The first electrode E21 of the second TFT TFT2 can be connected to the light shield pattern BSM through a third contact hole passing through the insulating layers ILD1, BUF2, GI2, ILD2, and ILD3. Here, in the metal patterns E11 to E22 of the fourth metal layer, an electric field having a high strength can be generated due to voltages swinging between the gate-on voltage and the gate-off voltage which have a large voltage difference.

A first planarization layer PLN1 covers the patterns E11 to E22 of the fourth metal layer. The first planarization layer PLN1 thickly covers the display region DA of the circuit layer 12 with an organic insulating material. When the first planarization layer PLN1 is applied on the circuit layer 12, the organic insulating material flows to an edge of the display panel 100 and covers a side surface of the circuit layer 12 in the bezel region BZ.

A fifth metal layer is formed on the first planarization layer PLN1. The fifth metal layer is insulated from the fourth metal layer by the first planarization layer PLN1. The fifth metal layer includes metal patterns in which a single-layered metal or two or more layered metals are stacked, which is patterned in a photolithography process. The fifth metal layer includes a metal pattern SD2 connecting a light-emitting element to the second TFT TFT2. The metal pattern SD2 is connected to the second electrode E22 of the second TFT TFT2 through a fourth contact hole passing through the first planarization layer PLN1.

A second planarization layer PLN2 is formed on the first planarization layer PLN1 to cover the metal patterns of the fifth metal layer. The second planarization layer PLN2 thickly covers the display region DA of the circuit layer 12 with an organic insulating material. A sixth metal layer is formed on the second planarization layer PLN2. The second planarization layer PLN2 planarizes a surface on which the sixth metal layer is formed.

The sixth metal layer includes metal patterns in which a single-layered metal or two or more layered metals are stacked, which is patterned in a photolithography process. The patterns of the sixth metal layer include an anode AND of the light-emitting element. The anode AND is in contact with the metal pattern SD2 connected to the second TFT TFT2 of each of the pixel circuits through a fifth contact hole passing through the second planarization layer PLN2.

In the light-emitting element layer 14, a bank BNK is formed on the second planarization layer PLN2 to cover an edge of the anode AND. In this situation, the bank BNK is formed in a pattern that divides an emission region (or an opening region) through which light passes to the outside from each of the pixels. Accordingly, the bank BNK can be referred to as a pixel-defining film. The bank BNK can include an organic insulating material having photosensitivity and can be patterned in a photolithography process. In addition, a spacer SPC having a predetermined height can be formed on the bank BNK. Here, the bank BNK and the spacer SPC can be integrated with the same organic insulating material. In addition, the spacer SPC secures a gap space between a fine metal mask (FMM) and the anode AND so that the FMM is not in contact with the anode AND in a deposition process of the light-emitting element formed of an organic compound.

A seventh metal layer used as a cathode CAT of the light-emitting element is formed on the bank BNK and an organic compound layer EL. The seventh metal layer is connected between the sub-pixels in the display region DA. Here, the organic compound layer EL can be referred to as an emission layer or an electroluminescent layer.

An encapsulation layer includes a multi-layered insulating layer covering the cathode CAT of the light-emitting element. The multi-layered insulating layer includes a first inorganic insulating layer PAS1 covering the cathode CAT, a thick organic insulating layer PCL covering the first inorganic insulating layer PAS1, and a second inorganic insulating layer PAS2 covering the organic insulating layer PCL.

A touch sensor layer includes a third buffer layer BUF3 covering the second inorganic insulating layer PAS2, sensor electrode wirings TE1 to TE3 formed on the third buffer layer BUF3, and an organic insulating layer PAC covering the sensor electrode wirings TE1 to TE3.

Each of the light-transmitting regions TA can include transparent media having high light transmittance without having metal so that light can be incident with minimum light loss. The light-transmitting region TA can be formed of transparent insulating materials without including metal lines or pixels.

The anode AND disposed in the pixel region can extend to the light-transmitting region TA to be connected to the adjacent dummy pixel R2 (e.g., slave pixel R2). Thus, the dummy pixel R2 disposed in the light-transmitting region TA can emit light by disposing the cathode CAT thereabove and applying a voltage to the electrode extension portion AND2 of the adjacent pixel placed therebelow.

Both the anode AND disposed in the pixel circuit region and the electrode extension portion AND2 extending to the light-transmitting region TA can be formed as transparent electrodes. However, the present disclosure is not necessarily limited thereto, and the anode AND disposed in the pixel circuit region can be formed as a reflective electrode, and only the electrode extension portion AND2 can be formed as a transparent electrode.

Figure 17:
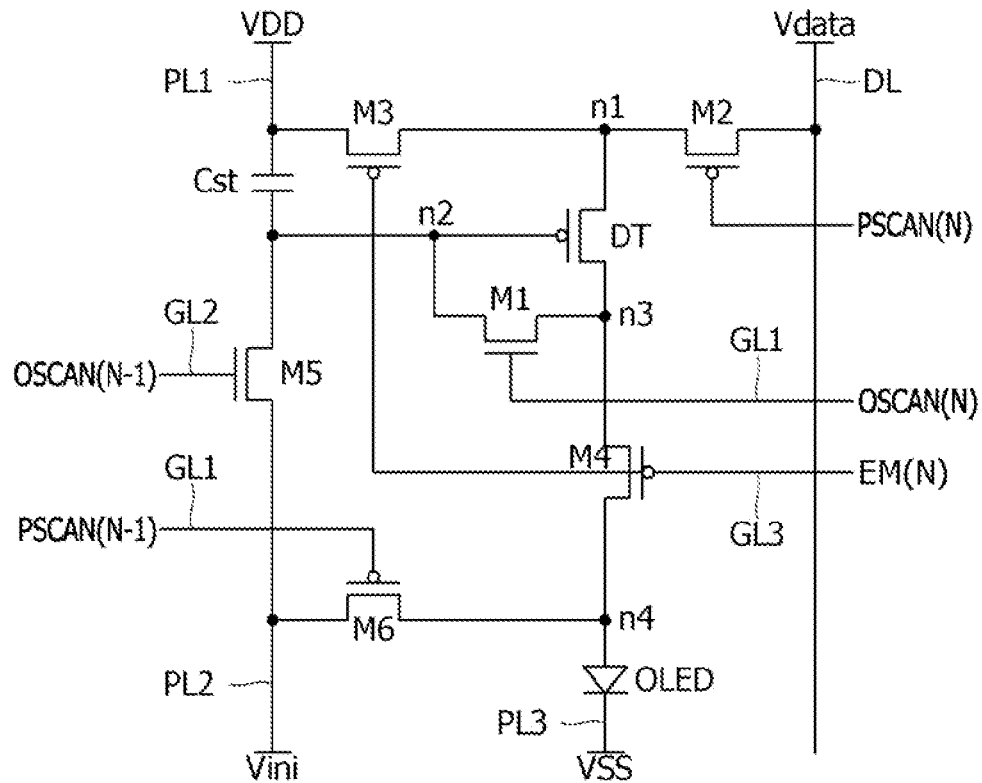
FIG. 17 is a diagram illustrating a first pixel circuit according to one embodiment of the present disclosure.
Figure 18:
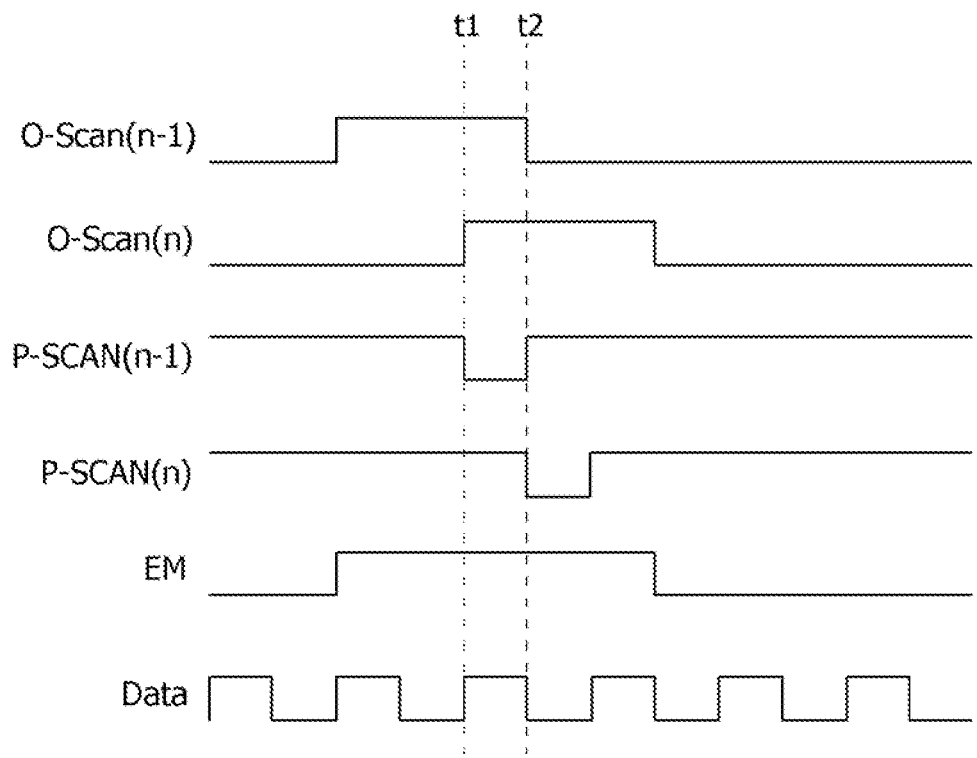
FIG. 18 is a timing diagram of the first pixel circuit according to one embodiment of the present disclosure.
Figure 19:
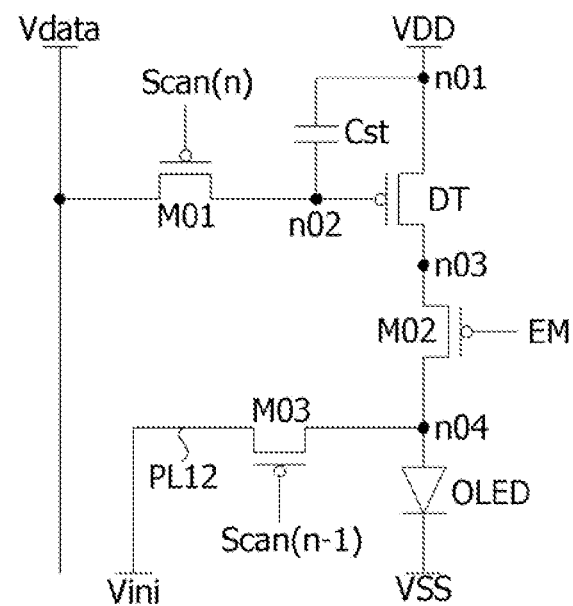
FIG. 19 is a diagram illustrating a second pixel circuit according to one embodiment of the present disclosure.
Figure 20:
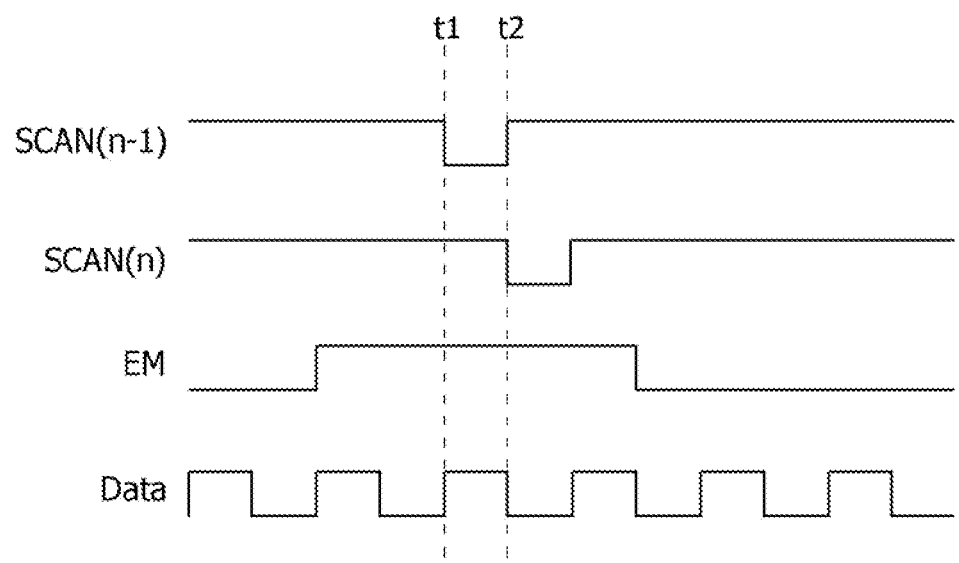
FIG. 20 is a timing diagram of the second pixel circuit according to one embodiment of the present disclosure.

FIG. 17 is a diagram illustrating the first pixel circuit according to an embodiment of the present disclosure. FIG. 18 is a timing diagram of the first pixel circuit according to an embodiment of the present disclosure. FIG. 19 is a diagram illustrating the second pixel circuit according to an embodiment of the present disclosure. FIG. 20 is a timing diagram of the second pixel circuit according to an embodiment of the present disclosure.

Referring to FIG. 17, the first pixel circuit PC1 according to one embodiment of the present disclosure is not particularly limited as long as it is an internal compensation circuit. As an example, the first pixel circuit PC1 can have various circuit structures such as 7T1C and 6T1C. Hereinafter, a situation in which the first pixel circuit PC1 is a 7T1C including an oxide transistor will be described as an example.

The first pixel circuit PC1 can include a light-emitting element OLED, a driving element DT configured to supply a current to the light-emitting element OLED, and an internal compensation circuit configured to sample a threshold voltage Vth of the driving element DT using a plurality of switch elements M1 to M6 and compensate for a gate voltage of the driving element DT by as much as the threshold voltage Vth of the driving element DT. Each of the switch elements M1 and M5 can be implemented as an n-channel TFT, and each of the driving element DT and the remaining switch elements M2 to M4 and M6 can be implemented as a p-channel TFT.

The light-emitting element OLED can be implemented as an organic light-emitting diode or an inorganic light-emitting diode. Hereinafter, a situation in which the light-emitting element OLED is implemented as an organic light-emitting diode will be described as an example.

The light-emitting element OLED can include an organic compound layer formed between an anode and a cathode. The organic compound layer can include a hole injection layer HIL, a hole transport layer HTL, an emission layer EML, an electron transport layer ETL, and an electron injection layer EIL, but the present disclosure is not limited thereto. When a voltage is applied to the anode and the cathode of the OLED, holes passing through the hole transport layer HTL and electrons passing through the electron transport layer ETL move to the emission layer EML to create excitons, and thus visible light can be emitted from the emission layer EML.

The anode of the light-emitting element OLED is connected to a fourth node n4 between fourth and sixth switch elements M4 and M6. The fourth node n4 is connected to the anode of the light-emitting element OLED, a second electrode of the fourth switch element M4, and a second electrode of the sixth switch element M6. The cathode of the light-emitting element OLED is connected to a VSS line PL3 through which a low-potential power supply voltage VSS is applied. The light-emitting element OLED emits light with a current Ids that flows according to a gate-source voltage Vgs of the driving element DT. A third switch element M3 and the fourth switch element M4 switch current paths of the light-emitting element OLED.

The driving element DT adjusts the current Ids, which flows in the light-emitting element OLED according to the gate-source voltage Vgs, to drive the light-emitting element OLED. The driving element DT includes a gate electrode connected to a second node n2, a first electrode connected to a first node n1, and a second electrode connected to a third node n3.

A storage capacitor Cst is connected between a VDD line PL1 and the second node N2. A data voltage Vdata, which is compensated for by as much as the threshold voltage Vth of the driving element DT, is charged to the storage capacitor Cst. Since the data voltage Vdata in each sub-pixel is compensated for by as much as the threshold voltage Vth of the driving element DT, a characteristic deviation of the driving element DT in each sub-pixel is compensated for.

A first switch element M1 is turned on in response to a gate-on voltage VGH of an Nth scan pulse OSCAN(N) to connect the second node n2 to the third node n3. The second node n2 is connected to the gate electrode of the driving element DT, a first electrode of the storage capacitor Cst, and a first electrode of the first switch element M1. The third node n3 is connected to the second electrode of the driving element DT, a second electrode of the first switch element M1, and a first electrode of the fourth switch element M4. A gate electrode of the first switch element M1 is connected to a first gate line GL1 to receive the Nth scan pulse OSCAN (N). The first electrode of the first switch element M1 is connected to the second node n2, and the second electrode thereof is connected to the third node n3.

A second switch element M2 is turned on in response to a gate-on voltage VGL of an Nth scan pulse PSCAN(N) to supply the data voltage Vdata to the first node n1. A gate electrode of the second switch element M2 is connected to the first gate line GL1 to receive the Nth scan pulse PSCAN(N). A first electrode of the second switch element M2 is connected to the first node n1. A second electrode of the second switch element M2 is connected to a data line DL through which the data voltage Vdata is applied. The first node n1 is connected to the first electrode of the second switch element M2, a second electrode of the third switch element M3, and the first electrode of the driving element DT.

The third switch element M3 is turned on in response to a gate-on voltage VGL of an emission signal EM(N) to connect the VDD line PL1 to the first node n1. A gate electrode of the third switch element M3 is connected to a third gate line GL3 to receive the emission signal EM(N). A first electrode of the third switch element M3 is connected to the VDD line PL1. A second electrode of the third switch element M3 is connected to the first node n1.

The fourth switch element M4 is turned on in response to the gate-on voltage VGL of the emission signal EM(N) to connect the third node n3 to the anode of the light-emitting element OLED. A gate electrode of the fourth switch element M4 is connected to the third gate line GL3 to receive the emission signal EM(N). The first electrode of the fourth switch element M4 is connected to the third node n3, and the second electrode thereof is connected to the fourth node n4.

A fifth switch element M5 is turned on in response to a gate-on voltage VGH of an (N-1)th scan pulse OSCAN(N-1) to connect the second node n2 to a Vini line PL2. A gate electrode of the fifth switch element M5 is connected to a second gate line GL2 to receive the (N-1)th scan pulse OSCAN(N-1). A first electrode of the fifth switch element M5 is connected to the second node n2, and a second electrode thereof is connected to the Vini line PL2.

The sixth switch element M6 is turned on in response to a gate-on voltage VGL of an (N-1)th scan pulse PSCAN(N-1) to connect the Vini line PL2 to the fourth node n4. A gate electrode of the sixth switch element M6 is connected to the first gate line GL1 to receive the (N-1)th scan pulse PSCAN(N-1). A first electrode of the sixth switch element M6 is connected to the Vini line PL2, and a second electrode thereof is connected to the fourth node n4.

Referring to FIG. 19, the second pixel circuit PC2 can include a non-compensation circuit or an external compensation circuit. As an example, as the second pixel circuit PC2, various non-compensation or external compensation circuits can be selected, such as a 2T1C or 4T1C structure. However, the present disclosure is not necessarily limited thereto, and an internal compensation circuit that performs an internal compensation function but has a smaller number of transistors than the first pixel circuit PC1 has can also be selected.

As an example, the second pixel circuit PC2 can have a 4T1C structure including a driving element DT, and first to third switch elements M01 to M03.

The driving element DT adjusts a current Ids, which flows in a light-emitting element OLED according to a gate-source voltage Vgs, to drive the light-emitting element OLED. The driving element DT includes a gate electrode connected to a second node n02, a first electrode connected to a first node n01, and a second electrode connected to a third node n03. A storage capacitor Cst is connected between the first node n01 and the second node n02.

The first switch element M01 is turned on in response to a gate-on voltage of an Nth scan pulse Scan(n) to supply a data voltage Vdata to the second node n02.

The second switch element M02 is turned on in response to a gate-on voltage of an emission signal EM to connect the third node N03 to an anode of the light-emitting element OLED. A gate electrode of the second switch element M02 receives the emission signal EM.

The third switch element M03 is turned on in response to a gate-on voltage of an (N-1)th scan pulse Scan(N-1) to connect a Vini line PL12 to a fourth node n04. A gate electrode of the third switch element M03 receives the (N-1)th scan pulse Scan(N-1).

Referring to FIGS. 18 and 20, the first pixel circuit PC1 and the second pixel circuit PC2 are commonly connected to a first scan line and have the same timings t1 and t2 at which data is written, and thus can use the same scan signal. In addition, the first pixel circuit PC1 and the second pixel circuit PC2 are connected to the same emission line, and thus can use the same emission signal.

Figure 21:
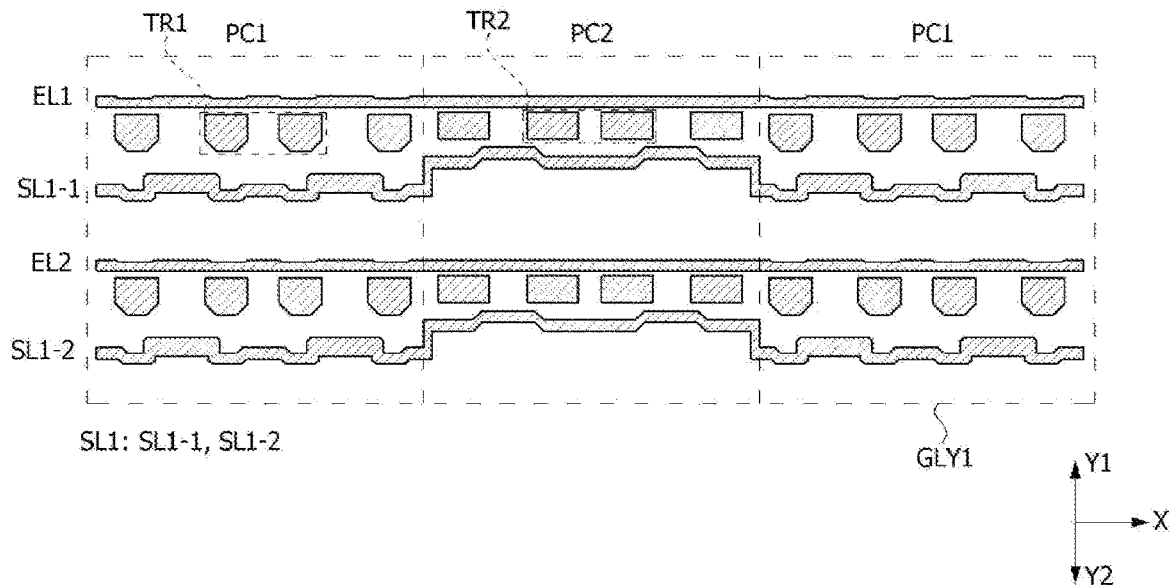
FIG. 21 is a view illustrating a first gate wiring layer of the boundary region according to one embodiment of the present disclosure.
Figure 22:
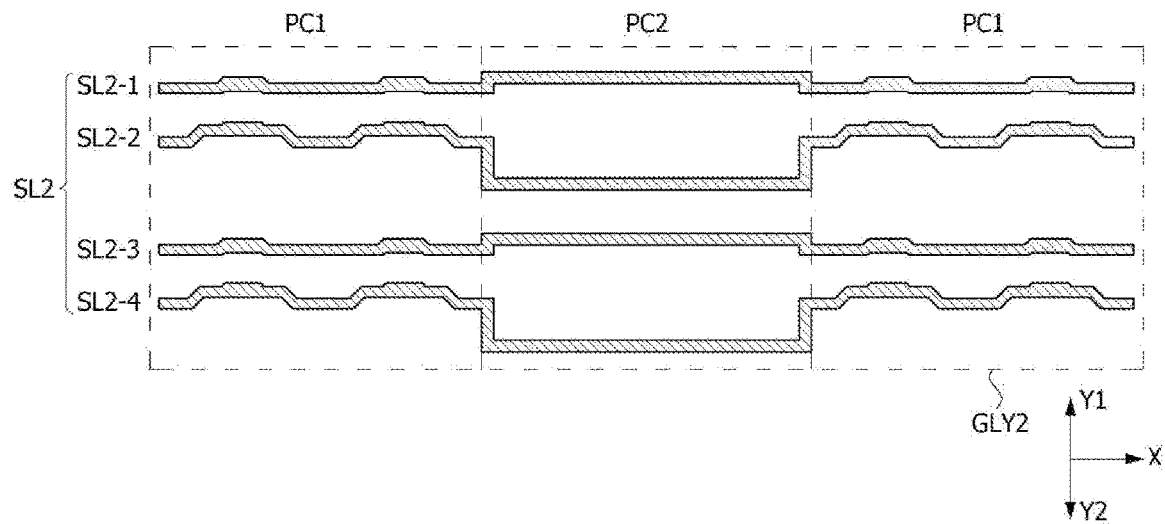
FIG. 22 is a view illustrating a second gate wiring layer of the boundary region according to one embodiment of the present disclosure.
Figure 23:
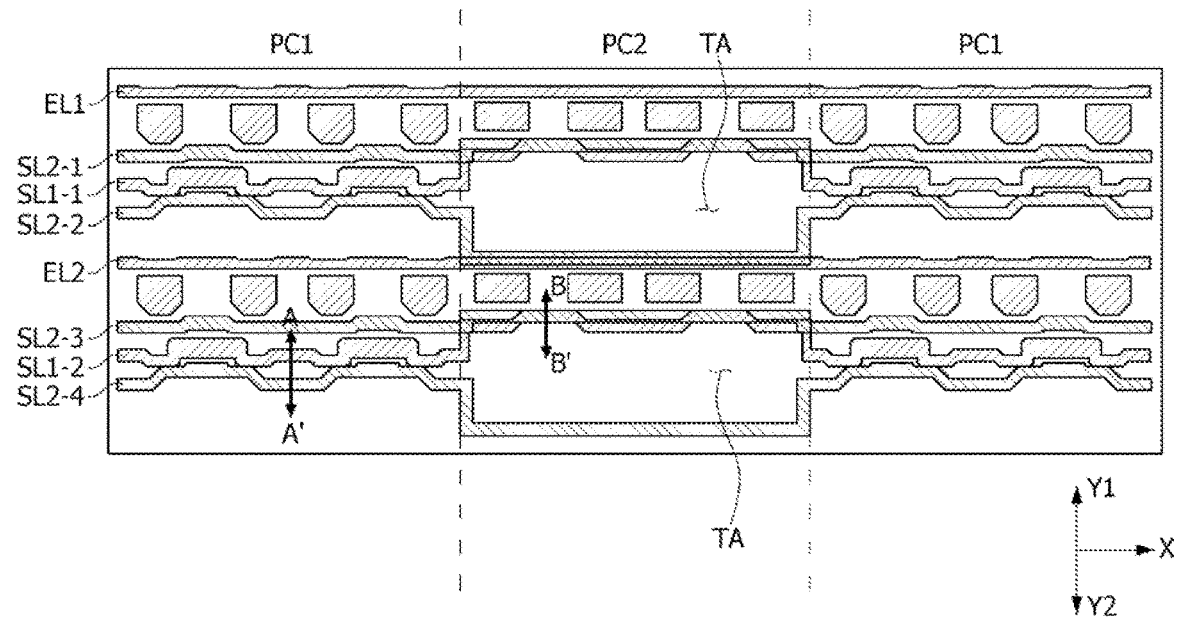
FIG. 23 is a view illustrating a state in which the first gate wiring layer, the second gate wiring layer, and a power wiring overlap according to one embodiment of the present disclosure.
Figure 24:
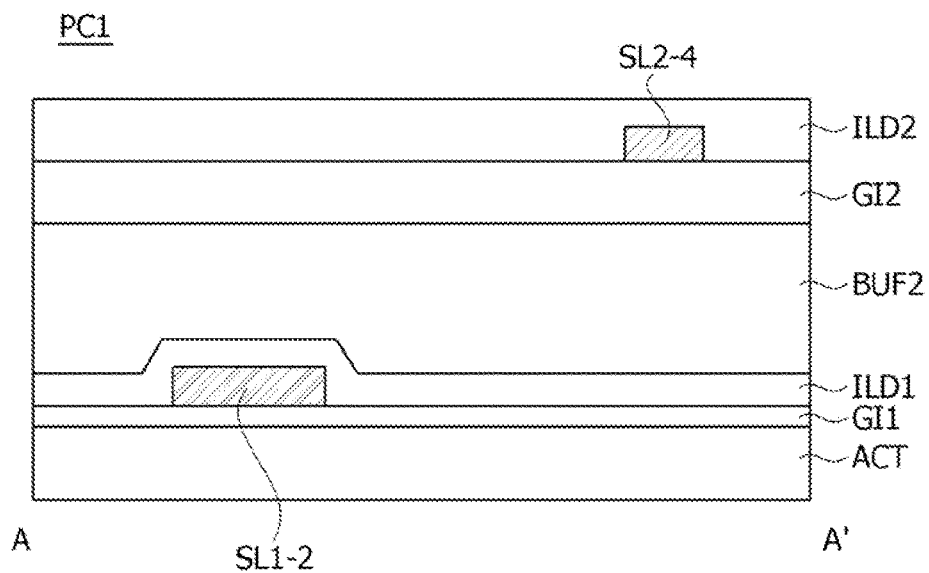
FIG. 24 is a cross-sectional view taken along line A-A' of FIG. 23 according to one embodiment of the present disclosure.
Figure 25:
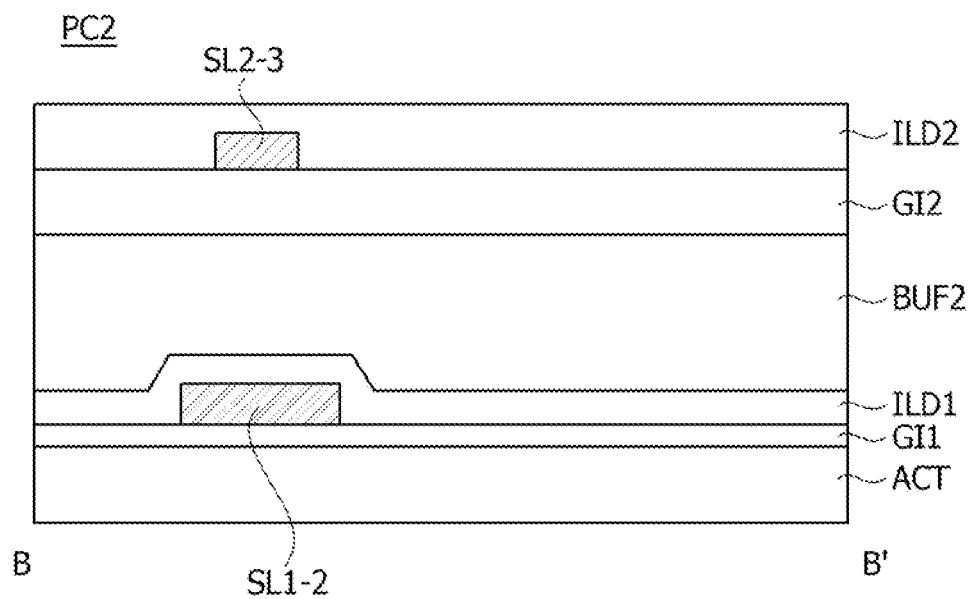
FIG. 25 is a cross-sectional view taken along line B-B' of FIG. 23 according to one embodiment of the present disclosure.

FIG. 21 is a view illustrating a first gate wiring layer of the boundary region according to an embodiment of the present disclosure. FIG. 22 is a view illustrating a second gate wiring layer of the boundary region according to an embodiment of the present disclosure. FIG. 23 is a view illustrating a state in which the first gate wiring layer, the second gate wiring layer, and a power wiring overlap according to an embodiment of the present disclosure. FIG. 24 is a cross-sectional view taken along line A-A' of FIG. 23 according to an embodiment of the present disclosure. FIG. 25 is a cross-sectional view taken along line B-B' of FIG. 23 according to an embodiment of the present disclosure.

Referring to FIGS. 21 and 22, as described above, the first pixel circuit PC1 and the second pixel circuit PC2 can be alternately disposed in the boundary region BA. Here, a pair of emission lines EL1 and EL2 and a plurality of first scan lines SL1 can be alternately disposed in a first gate wiring layer GLY1, and a plurality of second scan lines SL2 can be disposed in a second gate wiring layer GLY2.

According to the embodiment, in the first gate wiring layer GLY1, both the first pixel circuit PC1 and the second pixel circuit PC2 can have a first emission line EL1 and a 1-1 scan line SL1-1 that are disposed on both sides of transistors TR1 and TR2 to be adjacent and can be electrically connected to each other. Thus, when the gate line extends in a first direction (X-axis direction) from the first pixel circuit PC1 to the second pixel circuit PC2, a problem of bending the gate line does not occur. According to the embodiment, the first emission line EL1, the 1-1 scan line SL1-1, a second emission line EL2, and a 1-2 scan line SL1-2 can be sequentially disposed in a second-second direction (Y2-axis direction).

Referring to FIG. 23, the 1-1 scan line SL1-1 is bent upward in a second-first direction (Y1-axis direction) in the second pixel circuit PC2, and a 2-2 scan line SL2-2 is bent downward in the second-second direction (Y2-axis direction), so that the light-transmitting region TA is formed to be wide. For example, in the light-transmitting region TA, the 1-1 scan line SL1-1 and the 2-2 scan line SL2-2 bend away from each other to allow for a large opening space to transmit light (e.g., similar to two rivers flowing around opposite sides of an island or obstacle). In addition, the 1-2 scan line SL1-2 is bent upward in the second-first direction (Y1-axis direction) in the second pixel circuit PC2, and a 2-4 scan line SL2-4 is bent downward in the second-second direction (Y2-axis direction), so that the light-transmitting region TA is formed to be wide.

Referring to FIGS. 23 and 24, in the first pixel circuit PC1, since the plurality of first scan lines SL1 and the plurality of second scan lines SL2 are all connected and used, the first scan line SL1 and the second scan line SL2 do not overlap with each other in a thickness direction.

Referring to FIG. 25, in the second pixel circuit PC2, the second scan line SL2 is not connected. That is, the second scan line SL2 passes through the second pixel circuit PC2 and is not used in the second pixel circuit PC2. Thus, a portion of the first scan line SL1 can overlap with a second scan line SL2-3 in the second pixel circuit PC2. Accordingly, an aperture ratio can be increased.

Figure 26:
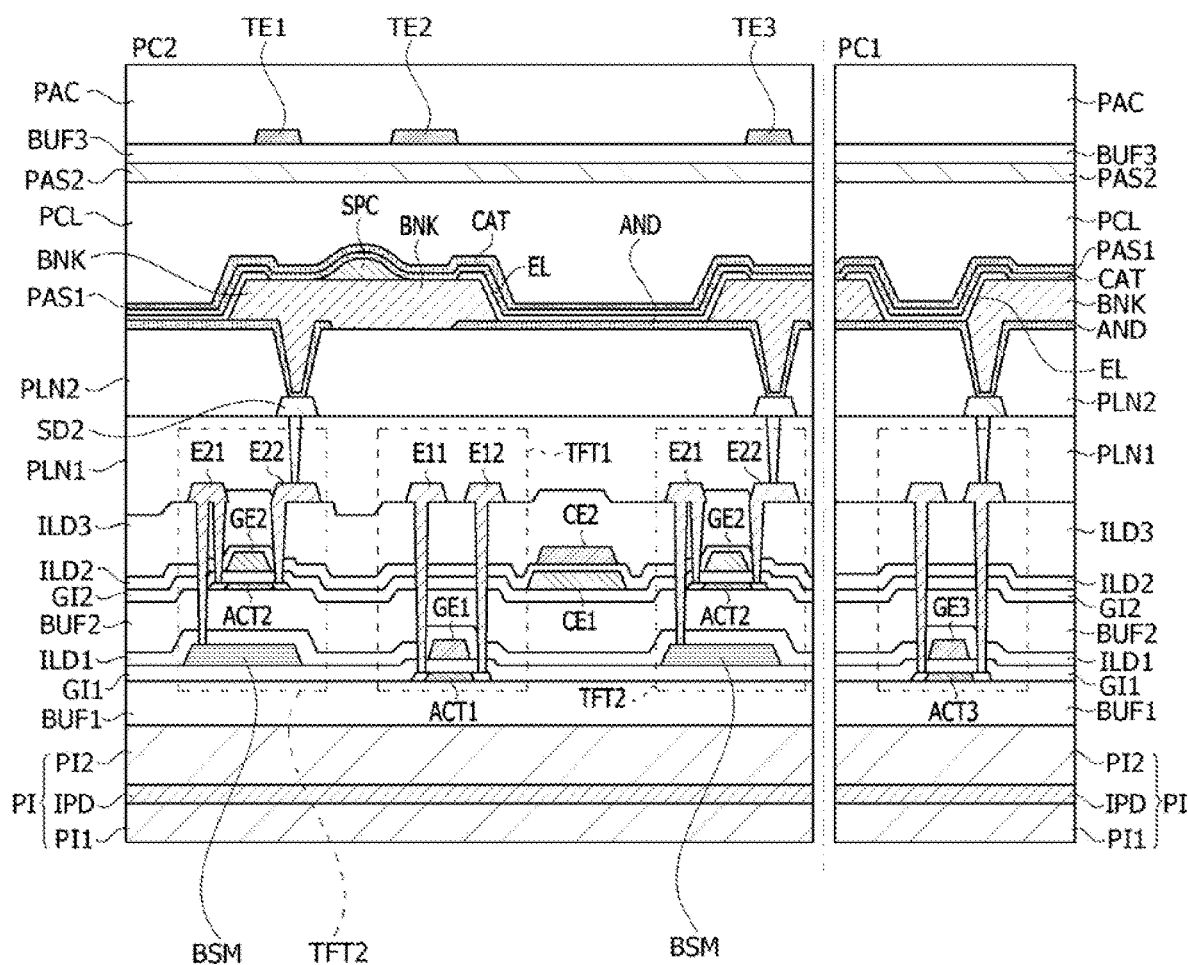
FIG. 26 is a view illustrating cross sections of the first pixel circuit and the second pixel circuit according to one embodiment of the present disclosure.

Referring to FIG. 26, as described in FIG. 16, the first pixel circuit PC1 includes a first active pattern ACT1, a first gate insulating film GI1 disposed on the first active pattern ACT1, a first gate electrode GE1 disposed on the first gate insulating film GI1, insulating layers ILD1 and BUF2 disposed on the first gate electrode GE1, a second active pattern ACT2 disposed on the insulating layers ILD1 and BUF2, a second gate insulating film GI2 disposed on the second active pattern ACT2, and a second gate electrode GE2 disposed on the second gate insulating film GI2.

The first active pattern ACT1 is a polysilicon active pattern that forms the semiconductor channel in the first TFT TFT1, and the second active pattern ACT2 is an oxide semiconductor pattern that forms the semiconductor channel in the second TFT TFT2.

The second pixel circuit PC2 can include a third active pattern ACT3 disposed on the same layer as the first active pattern ACT1, a third gate insulating film GI1 disposed on the third active pattern ACT3 and integrally formed with the first gate insulating film GI1, and a third gate electrode GE3 disposed on the third gate insulating film GI1 and disposed on the same layer as the first gate electrode GE1.

As described above, the gate lines GL can include the first scan line SL1 through which a gate signal is output to the first gate electrode GE1 of the first pixel circuit PC1 and the third gate electrode GE3 of the second pixel circuit PC2, and the second scan line SL2 through which a gate signal is output to the second gate electrode GE2 of the first pixel circuit PC1.

Since the content of the present disclosure described some limitations to be addressed by the present disclosure, the problem-solving means and effects do not specify essential features of the claims, the scope of the claims is not limited to matters described in the content of the disclosure.

According to an embodiment of the present disclosure, a boundary of an imaging region can be prevented from being visible. Thus, display quality can be improved. In addition, low-power driving can be enabled.

Effects of the present disclosure will not be limited to the above-mentioned effects and other unmentioned effects will be clearly understood by those skilled in the art from the following claims.

While the embodiments of the present disclosure have been described in detail above with reference to the accompanying drawings, the present disclosure is not necessarily limited to these embodiments, and various changes and modifications can be made without departing from the technical spirit of the present disclosure. Accordingly, the embodiments disclosed herein are to be considered descriptive and not restrictive of the technical spirit of the present disclosure, and the scope of the technical spirit of the present disclosure is not limited by these embodiments. Accordingly, the above-described embodiments should be understood to be examples and not limiting in any aspect. The scope of the present disclosure should be construed by the appended claims, and all technical spirits within the scopes of their equivalents should be construed as being included in the scope of the present disclosure.

What is claimed is:

1. A display device comprising:
   a first display region including a plurality of first pixels;
   a second display region including a plurality of second pixels; and
   a boundary region disposed between the first display region and the second display region,
   wherein the plurality of first pixels include a plurality of first pixel circuits, respectively,
   wherein the plurality of second pixels include a plurality of second pixel circuits which are different from the plurality of first pixel circuits, respectively,
   wherein the boundary region includes the plurality of first pixels including the plurality of first pixel circuits and the plurality of second pixels including the plurality of second pixel circuits,
   wherein a transmittance of each of the plurality of second pixel circuits is higher than a transmittance of each of at least one of the plurality of first pixel circuits,
   wherein the boundary region includes a pixel region in which at least one of the plurality of second pixels is disposed, a plurality of light-transmitting regions, and a dummy pixel disposed in the light-transmitting region, and
   wherein at least one of the plurality of second pixels includes an electrode extension portion extending from an anode and electrically connected to the dummy pixel.

2. The display device of claim 1,
   wherein the boundary region includes:
   a first boundary region in which a density of the plurality of second pixel circuits is higher than a density of the plurality of first pixel circuits; and
   a second boundary region disposed between the first boundary region and the first display region, and
   wherein a density of the plurality of first pixel circuits in the second boundary region is higher than a density of the plurality of second pixel circuits in the second boundary region.

3. The display device of claim 1, wherein the boundary region includes:
   a first boundary region in which a ratio of the plurality of first pixel circuits to the plurality of second pixel circuits is 1:1;
   a second boundary region disposed between the first boundary region and the first display region, a ratio of a plurality of first pixel circuits to a plurality of second pixel circuits in the second boundary region being 2:1; and
   a third boundary region disposed between the second boundary region and the first display region, a ratio of a plurality of first pixel circuits to a plurality of second pixel circuits in the third boundary region being 3:1.

4. The display device of claim 3, wherein an average maximum luminance of the third boundary region is higher than an average maximum luminance of the second boundary region.

5. The display device of claim 1, wherein a maximum luminance of the plurality of first pixels is different than a maximum luminance of the plurality of second pixels.

6. The display device of claim 1, wherein a number of transistors in each of the plurality of first pixel circuits is greater than a number of transistors in each of the plurality of second pixel circuits.

7. The display device of claim 1, wherein the anode is a reflective electrode, and the electrode extension portion is a transparent electrode.

8. The display device of claim 1, wherein at least some of the plurality of first pixels in the first display region and at least some of the plurality of second pixels in the second display region are connected to a same gate line.

9. The display device of claim 8, wherein the same gate line extends through the first display region, the boundary region and the second display region.

10. The display device of claim 8, wherein each of the plurality of first pixel circuits includes:
a first active pattern;
a first gate insulating film disposed on the first active pattern;
a first gate electrode disposed on the first gate insulating film;
an insulating layer disposed on the first gate electrode;
a second active pattern disposed on the insulating layer;
a second gate insulating film disposed on the second active pattern; and
a second gate electrode disposed on the second gate insulating film,
wherein the first active pattern is a polysilicon semiconductor layer, and
wherein the second active pattern is an oxide semiconductor layer.

11. The display device of claim 10, wherein each of the plurality of second pixel circuits includes:
a third active pattern disposed on a same layer as the first active pattern;
a third gate insulating film disposed on the third active pattern and integrally formed with the first gate insulating film; and
a third gate electrode disposed on the third gate insulating film and disposed on a same layer as the first gate electrode.

12. The display device of claim 11, wherein the same gate line includes:
a first scan line connected to the first gate electrode of the first pixel circuit and the third gate electrode of the second pixel circuit; and
a second scan line connected to the second gate electrode of the first pixel circuit, and wherein the first scan line and the second scan line overlap with each other in the boundary region.

13. The display device of claim 1, wherein a density per unit area of the plurality of first pixel circuits increases in the boundary region in a direction toward the first display region.

14. A display device comprising:
a first display region including a plurality of first pixels;
a second display region including a plurality of second pixels; and
a boundary region disposed between the first display region and the second display region,
wherein the plurality of first pixels include a plurality of first pixel circuits, respectively,
wherein the plurality of second pixels include a plurality of second pixel circuits which is different from the plurality of first pixel circuits, respectively,
wherein the boundary region includes the plurality of first pixels including the plurality of first pixel circuits and the plurality of second pixels including the plurality of second pixel circuits,
wherein a transmittance of each of the plurality of second pixel circuits is higher than a transmittance of each of at least one of the plurality of first pixel circuits,
wherein each of the plurality of first pixel circuits includes a compensation circuit, and
wherein each of the plurality of second pixel circuits excludes any type of compensation circuit.

15. A display panel comprising:
a first display region including a first type of pixel circuit;
a second display region including a second type of pixel circuit different from the first type of pixel circuit; and
a boundary region disposed between the first display region and the second display region, the boundary region including a mix of the first type of pixel circuit and the second type of pixel circuit,
wherein a transmittance of the second display region is higher than a transmittance of the first display region,
wherein a number of transistors in each of the plurality of first pixel circuits is different from a number of transistors in each of the plurality of second pixel circuits,
wherein the boundary region includes a pixel region in which at least one of the plurality of second pixels is disposed, a plurality of light-transmitting regions, and a dummy pixel disposed in the light-transmitting region, and
wherein at least one of the plurality of second pixels includes an electrode extension portion extending from an anode and electrically connected to the dummy pixel.

16. The display panel of claim 15, wherein the boundary region includes:
a first boundary region adjacent to the second display region;
a second boundary region; and
a third boundary region adjacent to the first display region,
wherein the second boundary region is disposed between the first boundary region and the third boundary region, and
wherein a transmittance of the first boundary region is higher than a transmittance of the second boundary region, and the transmittance of the second boundary region is higher than a transmittance of the third boundary region.

17. The display panel of claim 16, further comprising:
a plurality of subpixels disposed on a substrate,
wherein a density of the plurality of subpixels in the boundary region increases in a direction from the first display region toward the second display region.

18. The display panel of claim 17, further comprising:
a plurality of light-transmitting regions disposed in the second display region, the plurality of light-transmitting regions being configured to allow light to pass through the display panel, and
a plurality of slave subpixels disposed in the plurality of light-transmitting regions,
wherein each of the plurality of slave subpixels is connected to a corresponding one of the plurality of subpixels and is configured to emit light when the corresponding one of the plurality of subpixels emits light.

19. The display panel of claim 16, further comprising:
a plurality of gate lines and a plurality of data lines, wherein at least one gate line among the plurality of gate lines extends across both of the first display region and the second display region, and wherein at least one data line among the plurality of data lines extends across the second display region, crosses the at least one gate line and terminates before entering the first display region.

\* \* \* \* \*